(12) United States Patent
Abadeer et al.

(10) Patent No.: US 7,163,851 B2
(45) Date of Patent: Jan. 16, 2007

(54) CONCURRENT FIN-FET AND THICK-BODY DEVICE FABRICATION

(75) Inventors: Wagdi W. Abadeer, Jericho, VT (US); Jeffrey S. Brown, Middlesex, VT (US); David M. Fried, Ithaca, NY (US); Robert J. Gauthier, Jr., Hinesburg, VT (US); Edward J. Nowak, Essex Junction, VT (US); Jed H. Rankin, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 10/227,995

(22) Filed: Aug. 26, 2002

(65) Prior Publication Data

US 2004/0036118 A1 Feb. 26, 2004

(51) Int. Cl.
*H01L 21/84* (2006.01)
(52) U.S. Cl. ...................................... 438/157; 438/283
(58) Field of Classification Search ............... 438/157, 438/258, 242, 302, 259, 283, 206
See application file for complete search history.

(56) References Cited

U.S. PATENT DOCUMENTS

| | | | |
|---|---|---|---|
| 4,057,824 A | 11/1977 | Woods | |
| 5,498,882 A | 3/1996 | Houston | |
| 5,670,388 A | 9/1997 | Machesney et al. | |
| 5,684,319 A | 11/1997 | Hebert | |
| 5,767,549 A * | 6/1998 | Chen et al. | 257/347 |
| 5,929,490 A | 7/1999 | Onishi | |
| 6,191,450 B1 | 2/2001 | Maeda et al. | |
| 6,204,532 B1 | 3/2001 | Gambino et al. | |
| 6,207,985 B1 | 3/2001 | Walker | |
| 6,413,802 B1 * | 7/2002 | Hu et al. | 438/151 |
| 2006/0038216 A1 * | 2/2006 | Fried et al. | 257/296 |

OTHER PUBLICATIONS

T. Douseki, S. Shigematsu, J. Yamada, M. Harada, H. Inokawa, and T. Tsuchiya, "A 0.5-V MTCMOS/SIMOX Logic Gate," IEEE Journ. of Solid State Circuits, (Oct. 1997), pp. 1604-1609.*

* cited by examiner

Primary Examiner—Douglas W. Owens
(74) Attorney, Agent, or Firm—Schmeiser, Olsen & Watts; Richard M. Kotulak

(57) ABSTRACT

The present invention provides methods for fabrication of fin-type field effect transistors (FinFETs) and thick-body devices on the same chip using common masks and steps to achieve greater efficiency than prior methods. The reduction in the number of masks and steps is achieved by using common masks and steps with several scaling strategies. In one embodiment, the structure normally associated with a FinFET is created on the side of a thick silicon mesa, the bulk of which is doped to connect with a body contact on the opposite side of the mesa. The invention also includes FinFETs, thick-body devices, and chips fabricated by the methods.

22 Claims, 35 Drawing Sheets

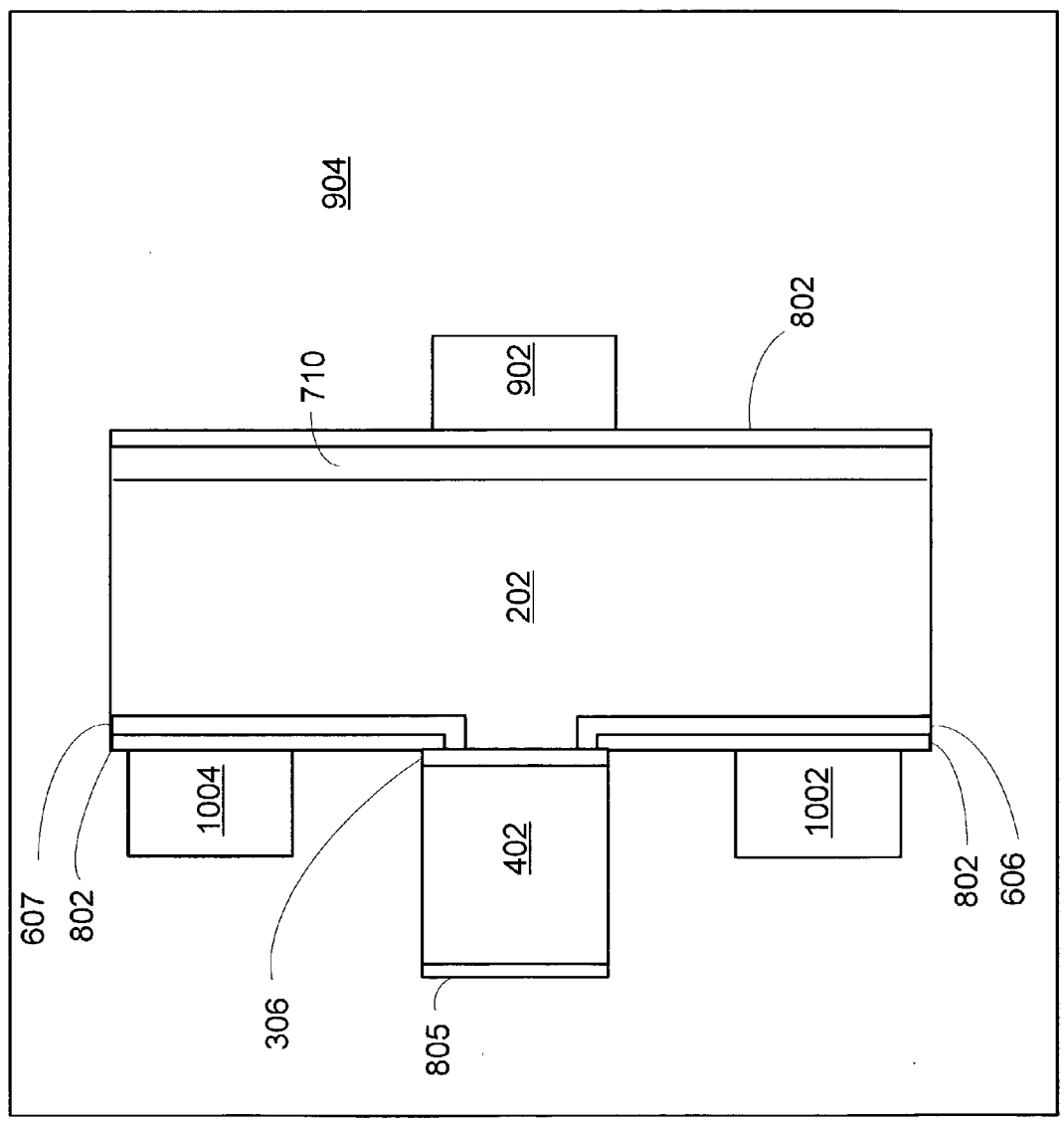

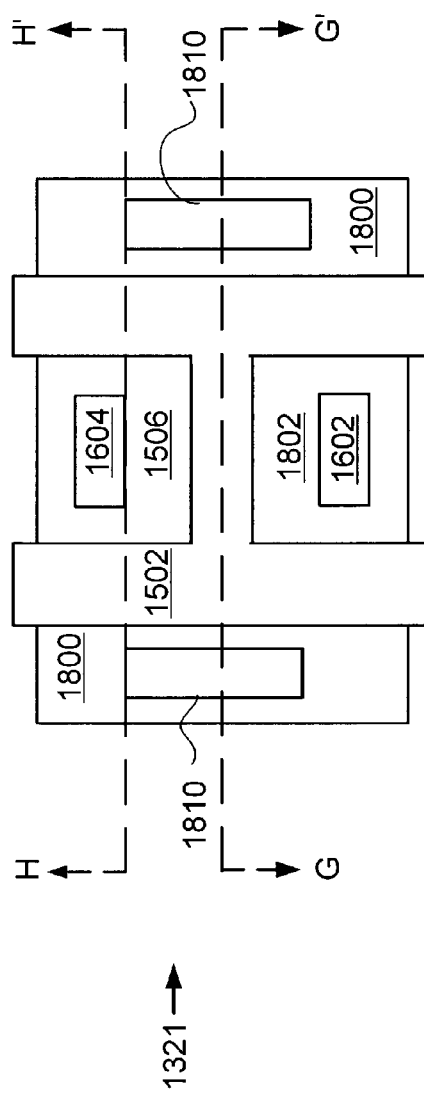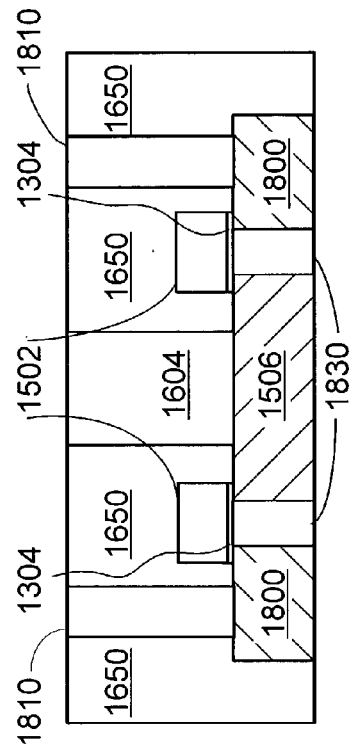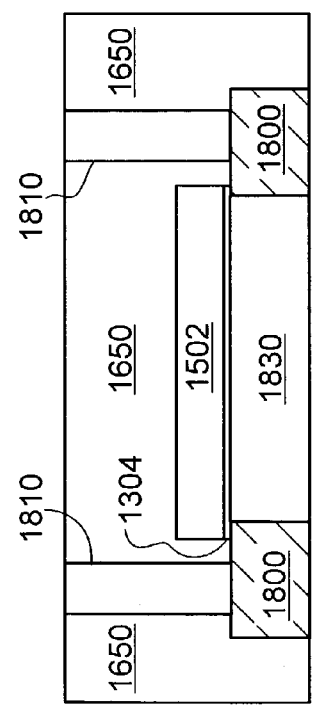

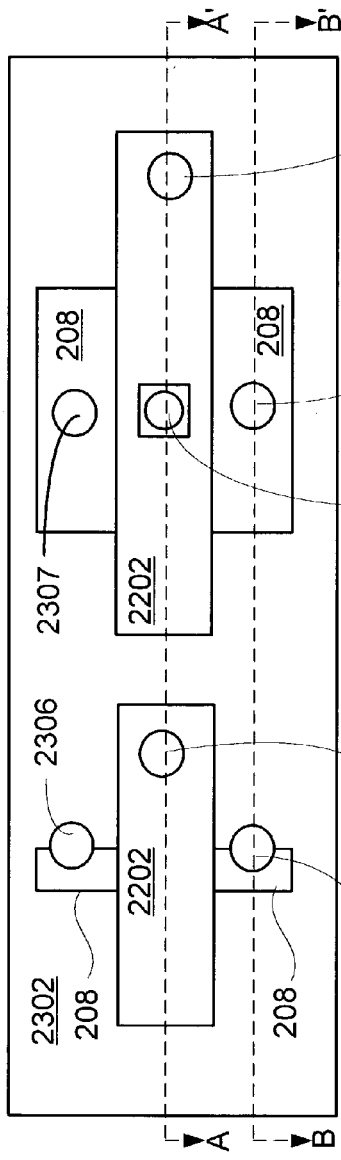
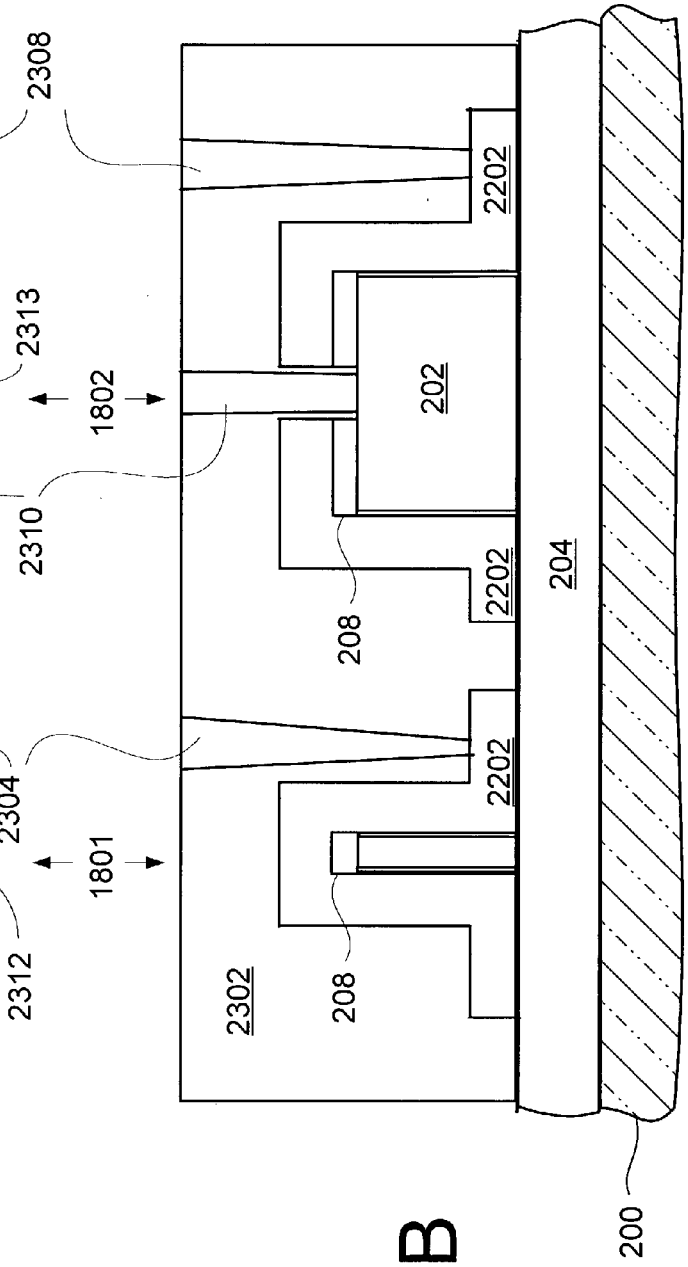
FIG. 26A
FIG. 26B

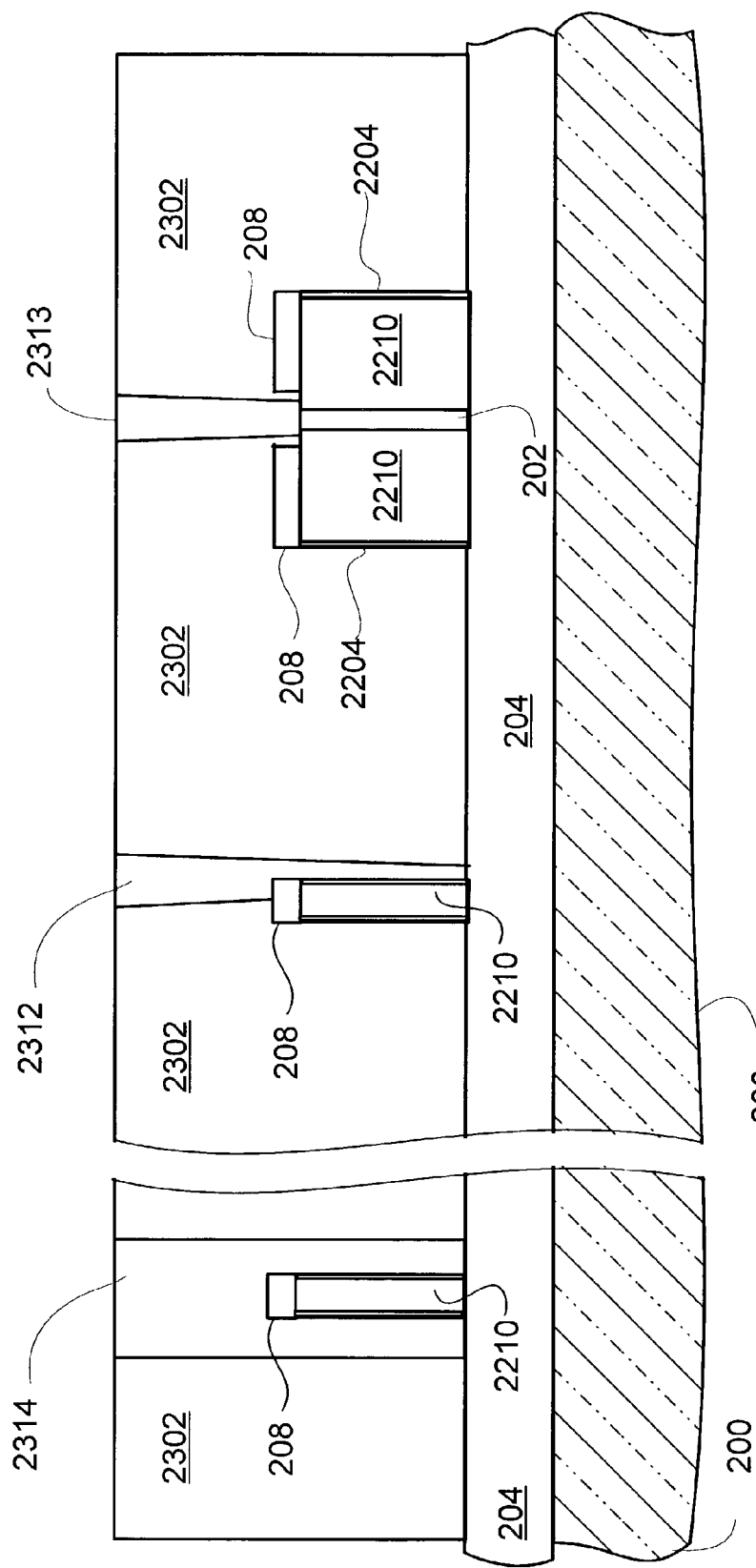

CONCURRENT FIN-FET AND THICK-BODY DEVICE FABRICATION

BACKGROUND OF THE INVENTION

1. Technical Field

The present invention relates generally to the field of semiconductor manufacturing and, more specifically, to methods of manufacturing thick-body devices on the same chip with fin-type field effect transistors (FETs). The present invention also relates to increasing the density of transistors on an integrated circuit chip and to fabricating thick-body devices such as, single-sidewall, body-contacted mesa FETs; double-sidewall, body-contacted mesa FETs; and planar mesa-top FETs.

2. Background

The need to remain cost and performance competitive in the production of semiconductor devices has caused continually increasing device density in integrated circuits. To facilitate the increase in device density, new technologies are constantly needed to allow the feature size of these semiconductor devices to be reduced. High device density also requires low-power operation.

The push for ever increasing device densities is particularly strong in CMOS technologies, such as in the design and fabrication of field effect transistors (FETs). FETs are used in almost all types of integrated circuit design (i.e., microprocessors, memory, etc.). Fin-type field effect transistors (FinFETs) are low-power, high speed, vertically scaled transistors that can be densely packed on a chip. Vertical scaling involves creating a thin wall of semiconductor (the "fin") and creating the FET on the side of the wall. Thin typically refers to widths that are less than minimum lithographic dimension.

Unfortunately, FinFETs are not suitable for all purposes. Different applications require different transistor device behaviors. Thin devices such as FinFETs reach full depletion during operation. This is desirable for many applications. Different behavior is required for other applications. Thick-body devices behave differently because they do not reach full depletion.

Some applications could benefit from having FinFETs and thick-body devices on the same chip. This has been difficult to achieve economically because the manufacturing steps for FinFETs and thick-body devices are different. Currently, one entire set of masks must be created and the associated steps taken for FinFETs and then another entire set of masks created and steps taken for thick-body devices. The masks protect thin technology devices while forming thick-technology devices, or vice versa. The use of a great multiplicity of masks and steps is expensive. Thus, there is a need for improved methods of fabrication of integrated circuits that use both FinFETs and thick-body devices on the same chip.

SUMMARY OF THE INVENTION

Accordingly, the present invention provides methods for fabrication of microelectronic circuit chips having fin-type field effect transistors (FinFETs) and thick-body devices on the same chip while using fewer masks and steps than prior methods. The reduction in the number of masks and steps is achieved by using common masks and steps with several scaling strategies. In one embodiment, the structure normally associated with a FinFET is created on the side of a thick silicon mesa, the bulk of which is doped to form a body contact on the side of the mesa opposite the source and drain. The invention includes methods for concurrently fabricating FinFETs with single-sidewall mesa FETs, double-sidewall mesa FETs, mesa-top planar FETs and combinations thereof. The invention also includes FinFETs, thick-body devices, and chips fabricated by the methods.

BRIEF DESCRIPTION OF DRAWINGS

The preferred exemplary embodiment of the present invention will hereinafter be described in conjunction with the appended drawings, where like designations denote like elements.

FIGS. 2–9B are views of an exemplary thick-body device during the steps of fabrication of an embodiment of a single-sidewall body-contacted mesa FET;

FIG. 2 is a vertical section view of an exemplary silicon-on-insulator substrate on a wafer having a hardmask;

FIG. 3 shows an example of some results of the steps of patterning and etching the substrate to form a mesa;

FIG. 4 shows an example of some results of the steps of growing a gate oxide, depositing gate material, and depositing a gate mask;

FIG. 5 shows an example of some results of the steps of opening the gate mask and etching the gate material as viewed in a vertical section plane through the gate;

FIG. 6 shows an example of some results of the steps of depositing a resist mask and doping the gate, source and drain; FIG. 6 contains two vertical section planes: one through the gate (for the gate, gate oxide, and mask) and another, nearer, plane through the drain region of the mesa (within the mesa);

FIG. 7 shows an example of some results of the steps of removing the resist mask of FIG. 6, depositing a new resist mask, and doping the body, as viewed in two vertical section planes: one through the gate (for the gate, gate oxide, and mask) and another, nearer, plane through the drain region of the mesa (within the mesa);

FIG. 8 shows an example of some results of the steps of removing the resist mask of FIG. 7, and forming a silicide, as viewed in two vertical section planes: one through the gate (for the gate, gate oxide, and silicide) and another, nearer, plane through the source region of the mesa (within the mesa);

FIG. 9A also defines a horizontal section plane A–A';

FIG. 9B shows an example of the device as viewed in horizontal section plane A–A' as defined in FIG. 9A;

FIGS. 10–11D are views of exemplary thick-body device during the steps of fabrication of an alternate embodiment of the single-sidewall mesa FET of FIGS. 2–9B;

FIG. 10 picks up where FIG. 4 left off and shows an example of some results of the steps of opening the gate mask and etching the gate material as viewed in a vertical section through the gate centerline;

FIG. 11 shows an example of some results of the steps of removing the gate mask of FIG. 10, doping the gate, sources and drains as in FIG. 6, doping the body as in FIG. 7, and forming a silicide as in FIG. 8, as viewed in a vertical section plane through the gate centerline;

FIG. 12A defines two horizontal section planes A–A' and B–B';

FIG. 12B defines vertical section plane F–F', which is the plane of FIGS. 10–12A;

FIG. 12C defines vertical section plane D–D' and repeats F–F'; D–D' is the plane of FIG. 12D; F–F' shows the intersection with two electrical contacts not previously shown;

FIG. 13 shows a vertical section view of an example of some results of the steps of patterning and etching exemplary substrate as from FIG. 2 to form a fin and a mesa;

FIG. 14 shows a vertical section view of an example of some results of the step of depositing a blocking mask over the fin and selectively etching the hardmask from the mesa;

FIG. 15 is a vertical section view wherein the section plane is nearer the observer then the previous sections used for this embodiment, showing an example of some results of the steps of growing a gate oxide on the fin and the mesa and of ion implanting source and drain wells into the mesa and the fin;

FIG. 16 shows a vertical section view, wherein the section plane is through the center line of the yet-to-be-formed gate, of an example of some results of the step of depositing gate material over the mesa and the fin;

FIG. 17 shows a vertical section view, wherein the section plane is through the center line of the newly-formed gates, of an example of some results of the steps of patterning and etching the gate material over the mesa and the fin;

FIG. 18 shows a planar view, wherein the section plane is through the center line of the gates, of an example of some results of the steps of encasing the mesa and the fin in oxide, patterning and etching the oxide to form holes for electrical contacts, and filling the holes with electrical contact material;

FIG. 18B shows a planar view of an example of some results of forming a planar mesa FET with body contacts, and showing sectional view lines G–G' and H–H' for FIGS. 18C and 18D respectively;

FIG. 18C shows a vertical section (G–G') view of an example of some results of forming a planar mesa FET with body contacts;

FIG. 18D shows a vertical section (H–H') view of an example of some results of forming a planar mesa FET with body contacts;

FIGS. 19–26D are views of exemplary fin and mesa FETS during the steps of fabrication of a body-contacted double-sided mesa FET embodiment of the invention;

FIG. 19 is a vertical section view of an exemplary silicon-on-insulator substrate on a wafer having a hardmask comprising two layers;

FIG. 20 shows an example of some results of the steps of patterning and etching the dual-layer hardmask to form a mesa and a fin;

FIG. 21 shows an example of some results of the step of chemically undercutting the lower layer of the two hardmask layers to achieve a narrowing of the lower hardmask layer;

FIG. 22 shows an example of some results of the step of removing the hardmask caps from the narrowed mesa and fin;

FIG. 23 shows an example of some results of selectively etching the active layer of the substrate down to the insulator to further form the mesa and the fin;

FIG. 24 shows an example of some results of the steps of forming a gate oxide and depositing gate material;

FIG. 24A defines a vertical section plane A–A';

FIG. 26A shows a plan view of some results of the steps of encasing the mesa and the fin in oxide, patterning and etching the oxide to form holes for electrical contacts, and filling the holes with electrical contact material; FIG. 24A defines a vertical section planes A–A' and B–B'. Plane A–A' is through the centerline of the gates and gate electrical contacts. Plane B–B' is through the drains and drain electrical contacts;

FIG. 26B shows a vertical section view of plane A–A' illustrating some results of the steps of encasing the mesa and the fin in oxide, patterning and etching the oxide to form holes, and filling the holes with electrical contact material;

FIG. 26C shows a vertical section view of plane B–B' illustrating some results of the steps of encasing the mesa and the fin in oxide, patterning and etching the oxide to form holes, and filling the holes with electrical contact material;

FIG. 26D shows a vertical section view of plane A–A' illustrating some results of the step of forming an alternate embodiment of a fin drain electrical contact.

DISCLOSURE OF THE INVENTION

Accordingly, the present invention provides methods for concurrently fabricating fin-type field-effect transistors (Fin-FETs) and thick-body FETS, also called thick body devices, on the same chip. Concurrent fabrication, as defined and used herein, means fabrication by a series of fabrication steps wherein at least one fabrication step uses one mask and at least one process associated with that mask for fabricating both a thick-body device and a FinFET. Efficiency is achieved by using concurrent masks and processes, whenever possible, to form the FinFETs and the thick-body devices.

Devices are considered to be thick, or to be thick-body devices, when the thickness of the silicon upon which the device is made is greater than that needed to form the source, drain, and gate-influenced regions of the transistor. Devices are thin, or fin-like, when their smallest dimension is the minimum lithographic dimension or smaller. In thin devices, the transistor is typically formed through the entire thin dimension. That is, the source, drain, and gate-influenced regions can be contacted on either or both sides of the thin dimension of the device.

Figures 1A, 1B:
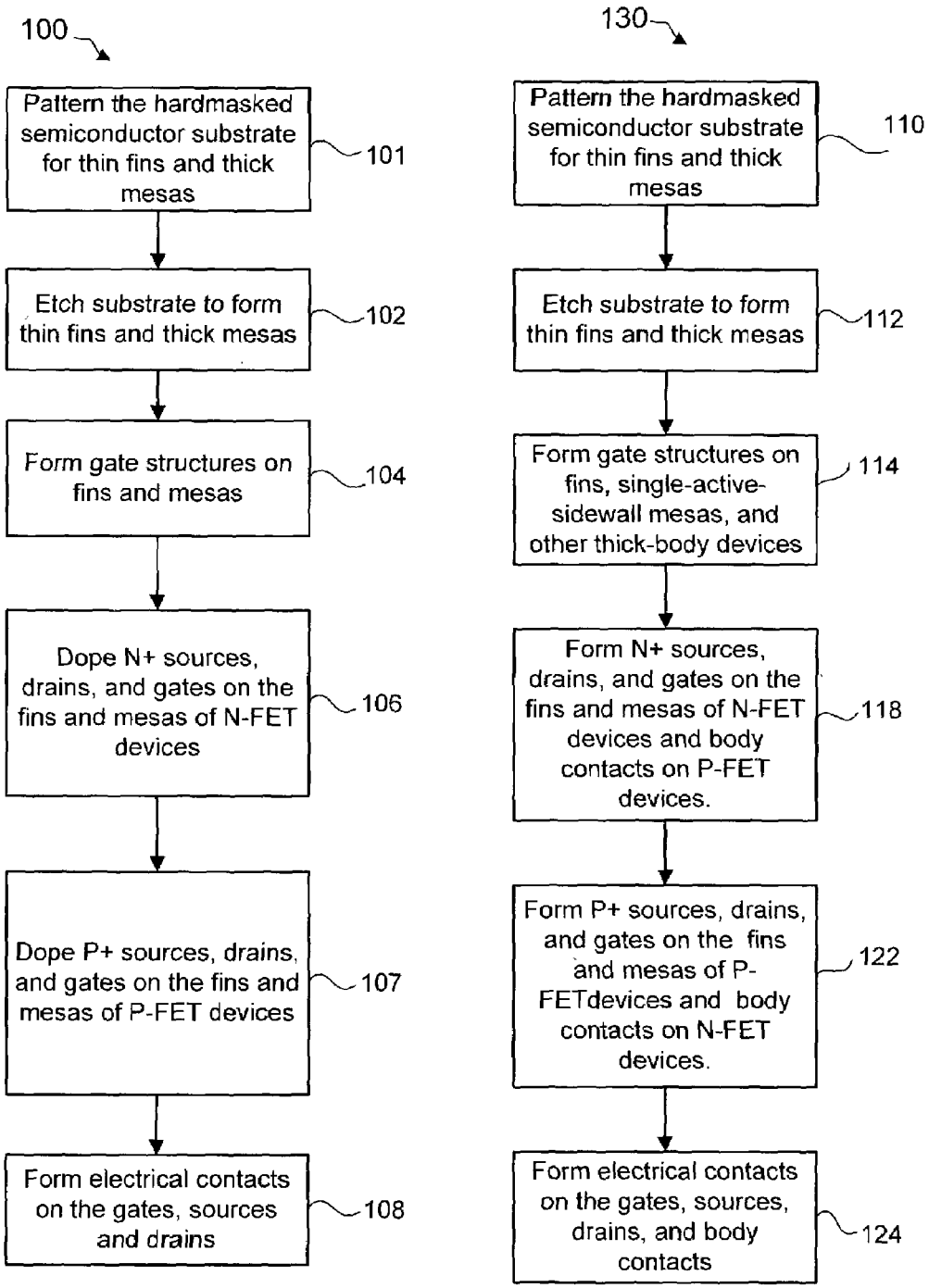
FIG. 1A is a process flow chart showing exemplary steps of fabrication of embodiments of the invention without body contacts.
FIG. 1B is a process flow chart showing exemplary steps of fabrication of embodiments of the invention with body contacts such as for sidewall mesa FETs.

FIG. 1A shows an example of an embodiment of a process 100 for concurrently forming thick and thin devices on the same chip. Process 100 begins by patterning 101 a hard-masked semiconductor substrate for both thin and thick structures. The substrate is typically silicon-on-insulator (SOI) with a buried oxide insulator. Other substrates, as known in the art, may be used. The single pattern may create any arrangement of thin and thick devices: thin and thick devices do not have to be segregated on the chip. The active sidewalls are those which will be doped to form the sources and the drains for transistors. The details of patterning a hard mask are otherwise well known in the art of semiconductor fabrication.

In step 102 of an example of an embodiment of a process 100, the substrate is etched down to the buried oxide layer. The thin fins are typically thinner than the minimum lithographic dimension. Chemical etching may be included within step 102 to achieve a fin thickness of less than minimum lithographic dimension. Those skilled in the art will appreciate that other methods for achieving sub-minimal lithographic dimensions may be used.

In step 104 of an example of an embodiment of a process 100, gate structures are formed on the fins and the thick-body devices. Step 104 comprises forming a gate oxide, depositing a gate material such as polysilicon, patterning the gate material, and selectively etching the gate material to achieve the desired shape and size. For the FinFETs of process embodiment 100, the gate material is etched to leave a thin block of gate material perpendicular to the fin and adjacent to both sides of the fin and adjacent portions of the buried oxide. A very thin gate oxide layer separates the gate material from the body. The top of the fin is insulated from contact with the gate by an insulating remnant of hardmask on the top of the fin. The gate material may be etched with a wider portion extended over the buried oxide to receive an electrical contact. The size and shape etched out of the gate material on the thick-body device depends on the type of device being formed. However the FET is created on the mesa, the gate is etched to divide the transistor's active surface into at least two regions: source and drain.

In step 106 of an example of an embodiment of a process 100, sources, drains, and gates for N-FET devices are formed by N+ doping of their respective regions via ion implantation through an implantation mask. In this embodiment 100, source and drain regions and gates for the fins and mesas are doped N+ concurrently. The pertinent regions of the various thin and thick-body devices on the chip are doped N+ in step 106. In most embodiments, the depth of ion implantation is the same for thin and thick devices. The depth used may deposit ions completely through the thickness of the fins but not the mesas. In other embodiments, depth of ion implantation may be varied as to create the desired device behavior. Customizing ion implantation depth generally requires additional masks and steps. N-FET devices and P-FET devices differ also in their body doping. Body doping may be accomplished by ion implantation or by forming the semiconductor layer with pre-doped material. P-FET devices are referred to as "complimentary devices" in reference to N-FET devices, and vice versa. The "N" or "P" designation may be referred to as the polarity of the N-FET or P-FET device.

In step 107 of an example of an embodiment of process 100, a complimentary mask is provided, and sources, drains, and gates for P-FET devices are formed by doping their respective regions via ion implantation through an implantation mask. In steps 106 and 107, FinFET sidewalls, mesa FET sidewalls, and planar FETs on mesa tops may be implanted at the same time. In some embodiments, the order of steps 106 and 107 may be reversed. The doping may be accomplished by angled ion implantation.

In step 108 of an example of an embodiment of a process 100, the thin and thick devices are encased in oxide. The oxide is then planarized and holes are patterned and etched to receive electrical contact material to form electrical contacts with the gates, the sources and the drains. The electrical contact material may be tungsten or other suitable metal as is known in the art.

Another example of an embodiment of a process 130 shown in FIG. 1B features the modified steps 114, 118 and 122 of forming body contacts on the mesas and forming the electrical contacts 124 for the body contacts. Because the FinFETs are usually fully depleted, body contacts would be superfluous and are ordinarily not used. In step 114, gate structures are formed for single-active-sidewall mesa FETs. Single-active-sidewall mesa FETs have a FET vertically scaled on one sidewall of the mesa. In most embodiments, the gate is formed on a gate oxide perpendicularly over the middle of the FET, dividing source and drain regions. The gate further rests on the top of the mesa and on the base oxide of the chip.

In step 118, the sources, drains, and gates of the N-FET devices, as well as the body contacts of any complimentary (P-FET) devices, are doped N+ via ion implantation through an implantation mask. While the P+ body contacts are formed in step 122 for the mesa N-FETs, the sources, drains, and gates of the complimentary devices are also formed via ion implantation through an implantation mask. This is accomplished by selectively covering sources, drains and gates of the mesa N-FET as well as the body contact region of any complimentary mesa FET with the implantation mask. For a single-active-sidewall mesa FET, the body contact is formed 118 by doping the mesa body through the inactive sidewall to form a body contact region adjacent to the body. The steps 110–112 of embodiment 130 are similar to the steps of the same name in process 100, but are adapted to the creation of body contacts. For example, the pattern of step 110 for a device using body contacts may be different from the pattern of the step 101 of a device that does not use body contacts.

Step 124 includes the sub-steps of forming sidewall spacers on the vertical surfaces of the gate and then growing a silicide layer over the exposed silicon surfaces of the thick-body devices and FinFETs to provide ohmic connections between the electrical contacts and the sources, drains, gates, and body contacts. In an alternate embodiment in which FinFETs with body contacts are used, the FinFET body contact may be formed (deposited, planarized, patterned, and etched) during the gate formation step 114 and doped during steps 118 and 122. In a variation of the alternative embodiment, the gate and the body contact may both be formed from one deposition of polysilicon wherein the gate and body contact are later differently doped. In another alternative, the FinFET body contact may be formed separately from the gate formation step 114. To complete step 124, the devices are encased in oxide which is planarized, patterned, etched to form holes and the holes are filled with metal to form the electrical contacts with the devices.

Figures 1C, 1D:
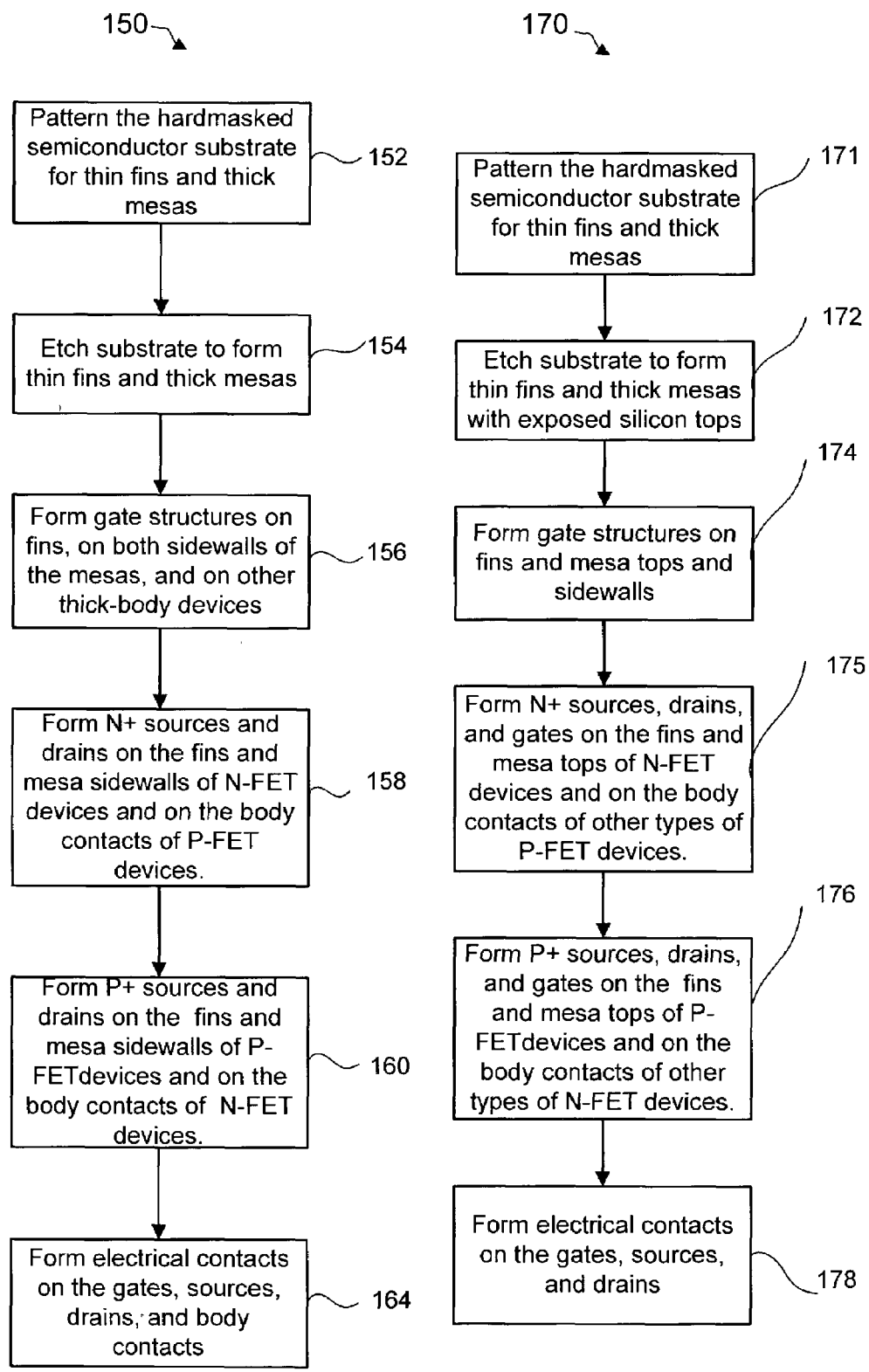
FIG. 1C is a process flow chart showing exemplary steps of fabrication of an embodiment of the invention comprising fabrication of a double-sidewall mesa FET.
FIG. 1D is a process flow chart showing exemplary steps of fabrication of an embodiment of the invention comprising a mesa-top planar FET.

Another example of an embodiment of the process 150, as shown in FIG. 1C, provides steps 152–164 specific to forming mesa FETS with two active sidewalls on the same chip with FinFETs. Steps 152 and 154 form, among other structures, mesas dimensioned specifically to be double-sidewall FETs. Additional sub-steps may be required for the second sidewall FET, depending on the design of the specific doublesidewall FET. As with the other process embodiments, the ion implantation steps (step 158 and step 160, in FIG. 1C) may be performed in reverse order. In step 158, the source and drain regions, as well as the gate on a first mesa sidewall on each mesa and each FinFET, are all concurrently doped N+. Step 158 further comprises doping the source and drain regions and the gate on a second mesa sidewall. In some embodiments, the FinFETs may be masked during the second sidewall source, drain and gate doping 158 to prevent excessive doping of the FinFETs. Alternatively, the FinFETs can be masked during the first sidewall source, drain, and gate doping 158, and the FinFETs can then be doped concurrently with the second mesa sidewall source and drain doping 158. Step 158 concurrently dopes the body contacts of any P-FET devices on the same chip.

In yet another set of embodiments, the source and drain regions of the doublesidewall mesa FETs are doped in step 158 to meet within the mesa to form a single, continuous source region and a single, continuous drain region in each doublesidewall mesa FET. In a subset of double-sidewall mesa FETs with continuous source and drain regions, the source and drain are ion-implanted 158 through one sidewall only, and the doping reaches completely through the width of the mesa. The body may be formed as an un-doped volume of the mesa body beneath the gate and between the two active sidewalls. In an alternative embodiment, the mesa may be doped as a body before the gates, sources, and drains are formed and the portion of the mesa that remains as the body after step 158 retains the original body doping of the mesa.

Step 160 is the P+ compliment of step 158. In step 160, the body contacts of N-FET devices on the chip are concurrently doped 160. Note that the body contact of a double-sidewall mesa FET is typically through the top of the mesa, so an etching sub-step is typically required. In an embodiment, the etching through the top hardmask to the mesa body to allow doping of a body contact region may be done as part of the gate etching step.

Electrical contact access to the body is gained by patterning and etching a hole through the gate material and the hardmask and doping 160 the body portion thereby exposed for good ohmic connection with the electrical contact. The portion of the body doped for ohmic electrical connectivity is known as the body contact. Step 164 includes encasing the device in an insulating oxide, planarizing the oxide, patterning the oxide for electrical contact holes, etching the electrical contact holes for the source, drain, gate and body contact, and filling the electrical contact holes with electrical contact material such as tungsten or other suitable conductor as is known in the art. Source, drain, and gate electrical contacts for the FinFETs are also formed concurrently as part of step 164.

FIG. 1D shows an example of an embodiment of a process 170 specific to forming planar FETs without body contacts on mesa tops while forming FinFETs on the same chip. The pattern used in step 171 sets the dimensions for, among other structures, at least one mesa suitable for having a planar FET formed on the top surface of the mesa. The etching step 172 includes removing the hardmask from the mesa tops but not from the tops of the fins. This is accomplished by depositing a block mask over the fins and etching away the hardmask on the exposed mesa tops selective to the block mask. The mesa top must be exposed for planar FET fabrication. The block mask over the fins is then stripped.

In step 174, a gate oxide is grown on exposed silicon surfaces. Growing the gate oxide may be achieved by a uniform growth method, a resist-based dual oxide, or N2 ion-implant dual oxide process to get different oxide thicknesses on fins and mesa tops. Gate material is then deposited over the gate oxide. The gate material is next planarized, patterned, and etched to form the gate and remove the gate oxide except where it is covered by remaining gate material. Note that, because process 170 produces no body contacts, the gate forming-step 174, may be performed after doping steps 175 and 177.

The N+ doping of sources, drains, and gates, step 175, begins with the formation of a sacrificial oxide followed by ion implantation and stripping of the sacrificial oxide. In embodiment 170, step 175 concurrently dopes me body contacts of other types of P-FET thick body devices elsewhere on the chip.

Step 176 is the P+ compliment of step 175. In step 176, the sources, drains, and gates of mesa-top planar P-FETs are doped concurrently with the body contacts of N-FET devices of other types of thick-body devices elsewhere on the chip. Note that the mesa-top planar FETs produced by process 170, like FinFETs, do not usually have body contacts.

Finally, in step 178, the chip is encased in an oxide, planarized, patterned for electrical contact holes, etched, and the etched holes filled with electrical contact material to make electrical contact with the sources, drains, and gates.

Figure 1E:
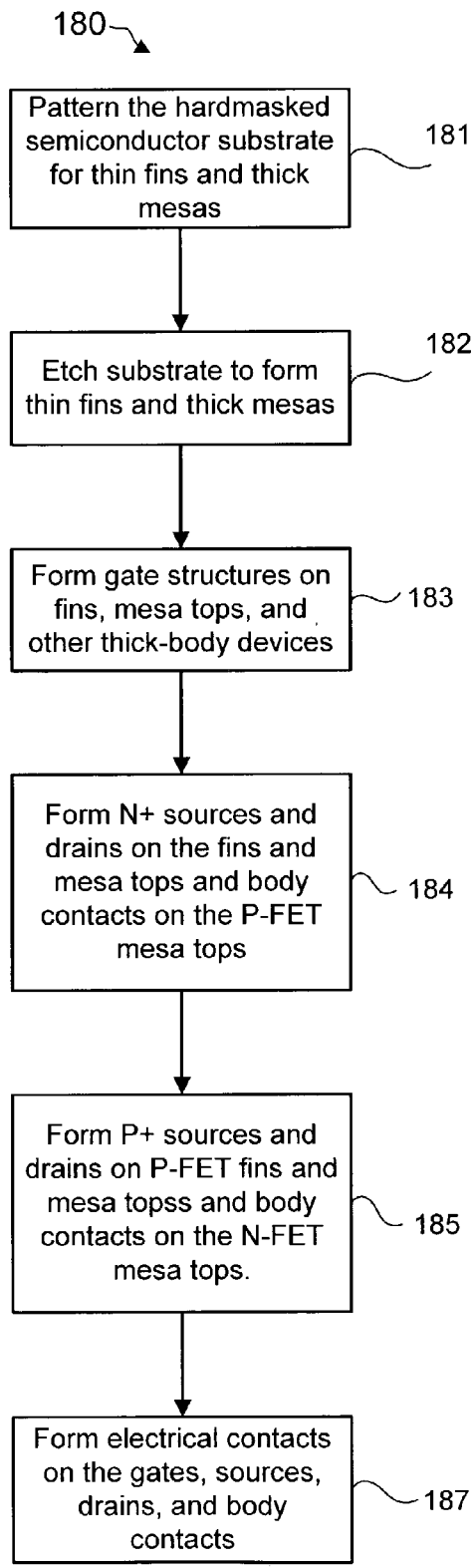
FIG. 1E is a flow chart of an example of an embodiment of a process for forming mesa-top FETs with body contacts.

FIG. 1E shows an example of an embodiment of a process 180 for forming mesa-top FETs with body contacts. In step 183, an "H"-shaped gate structure is formed on the mesa top, dividing the mesa top into four regions. See FIG. 1 8A. The "H" comprises a crossbar and two sidebars generally perpendicular to the crossbar. The regions above and below the crossbar are the drain and source regions, respectively. The areas to the left and right of the vertical bars are the body contact regions. The patterning 181 and etching 182 steps may be adapted to support this gate shape. In step 184, a block mask is opened for N+ doping of the sources and drains of the N-FET devices while the body contact regions of the N-FET devices are closed by a block mask and while the body contact regions of the P-FET devices are doped. In step 185, a block mask is opened for P+ doping of the sources and drains of the P-FET devices while the body contact regions of the P-FET devices are closed by a block mask and while the body contact regions of the N-FET devices are doped. Step 187 is adapted to the specific configuration of the "H"-shaped gate to provide electrical contacts to the gates, sources, drains, and body contacts.

The processes 100, 130, 150, 170, and 180 are intended to both produce thin and thick-body device concurrently and to be usable concurrently. Thus, a concurrent patterning step can include steps 101, 110, 152, 171, and 181. Likewise, concurrent etching, gate forming, ion implanting, and electrical contacting steps are possible. Those of skill in the art will appreciate the many concurrent combinations of processes 100, 130, 150, 170, and 180 that are possible.

Figure 2:
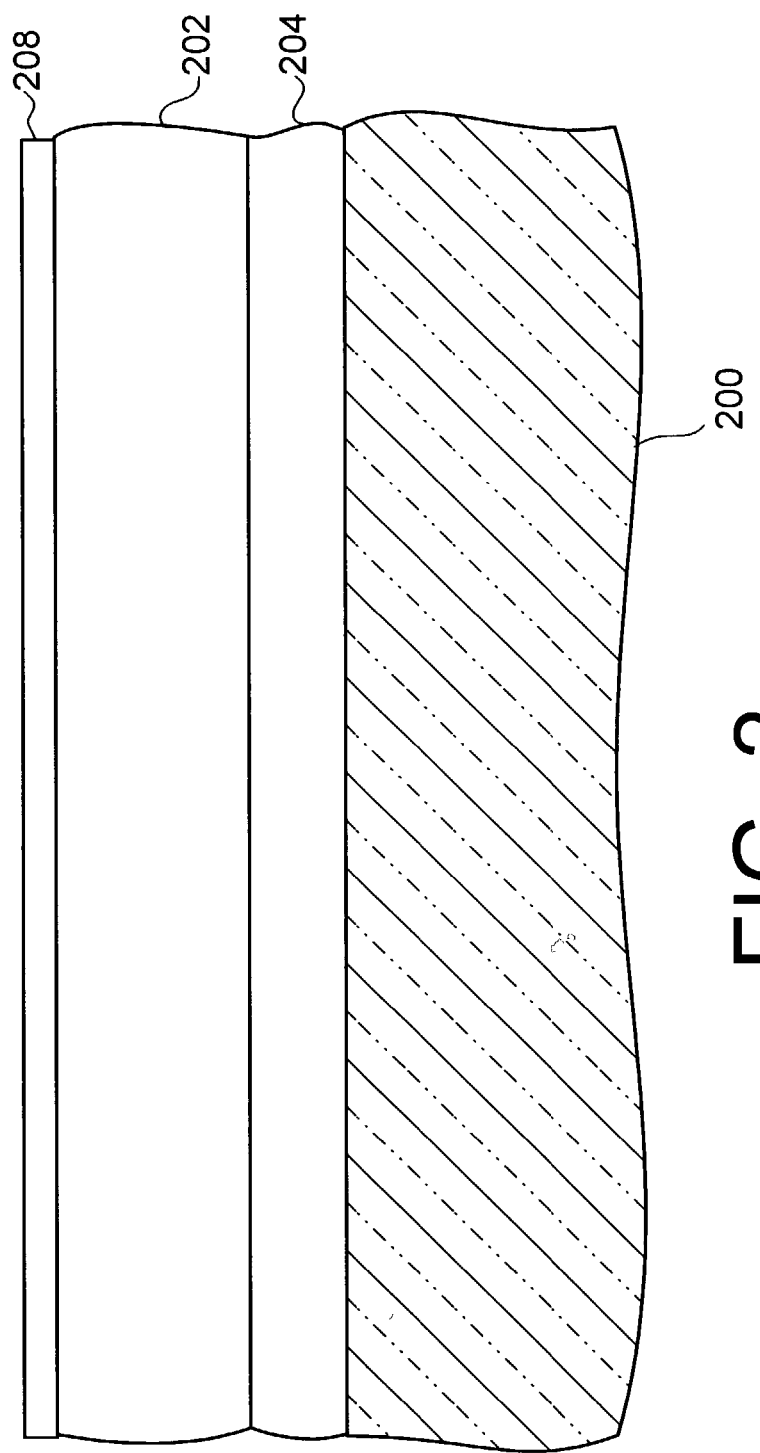

FIG. 2 shows an exemplary embodiment of a fabrication process 130 (FIG. 1B) for a thick-body device to be formed concurrently with FinFETs. Embodiment of a process 130

(FIG. 1B) begins with a SOI substrate 200, 204, and 202 having a hardmask 208. The substrate comprises a wafer 200, a buried oxide 204, and single crystal silicon 202 which is doped P−. Additional embodiments may use other substrates.

Figure 3:
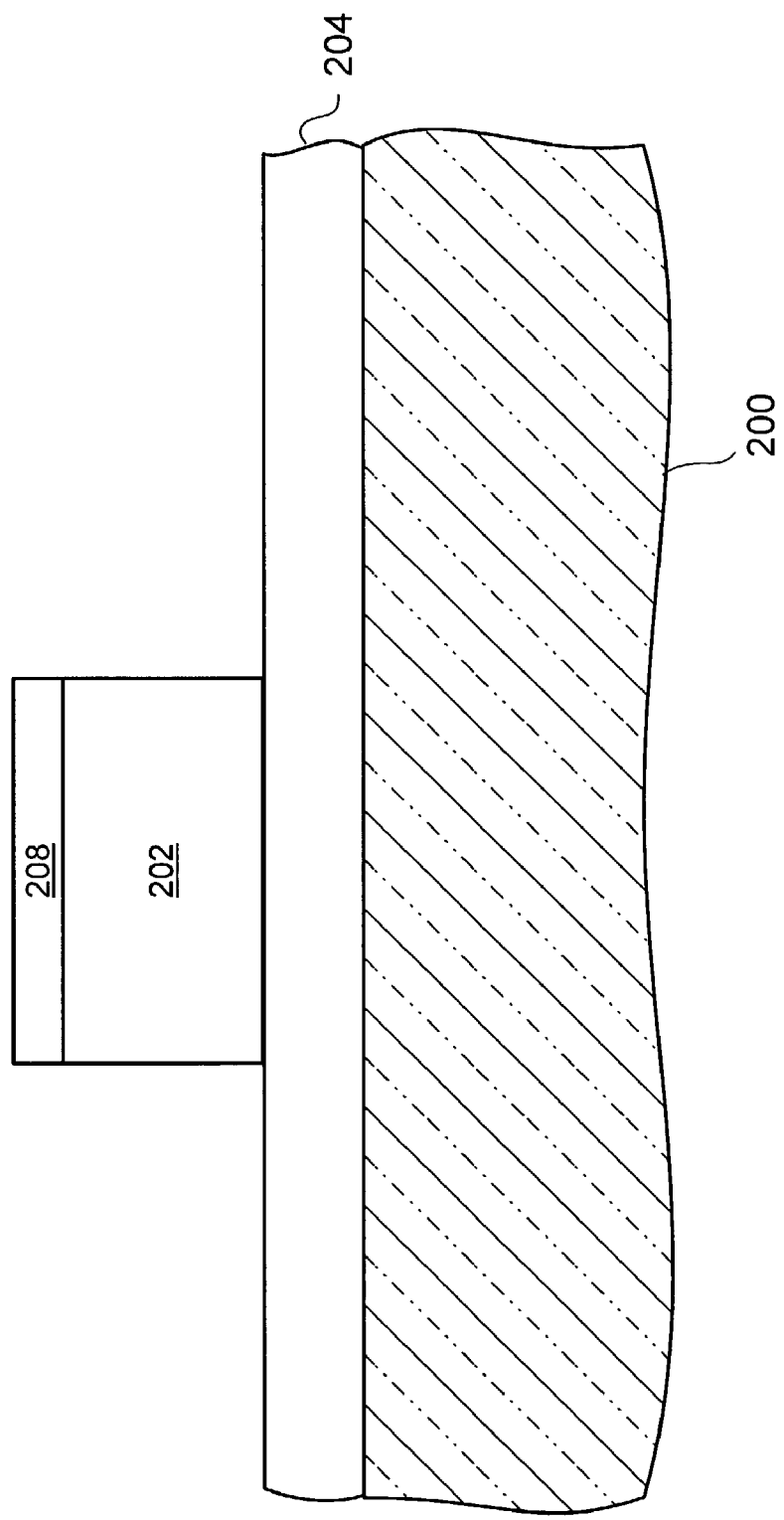

FIG. 3 illustrates the result of patterning 110 (FIG. 1B) and etching 112 (FIG. 1B) the thick-body device in an embodiment of a process 130 (FIG. 1B). The result is a mesa of silicon 202 on the buried oxide 204 having a hardmask cap 208. Fin devices on the same substrate in the exemplary embodiment of the process 130 (FIG. 1B) are not shown, but appear much like the mesa, only thinner. FIGS. 3 through FIG. 12D show one single-sidewall mesa FET, a thick-body device, as representative of all similar devices on the chip.

Figure 4:
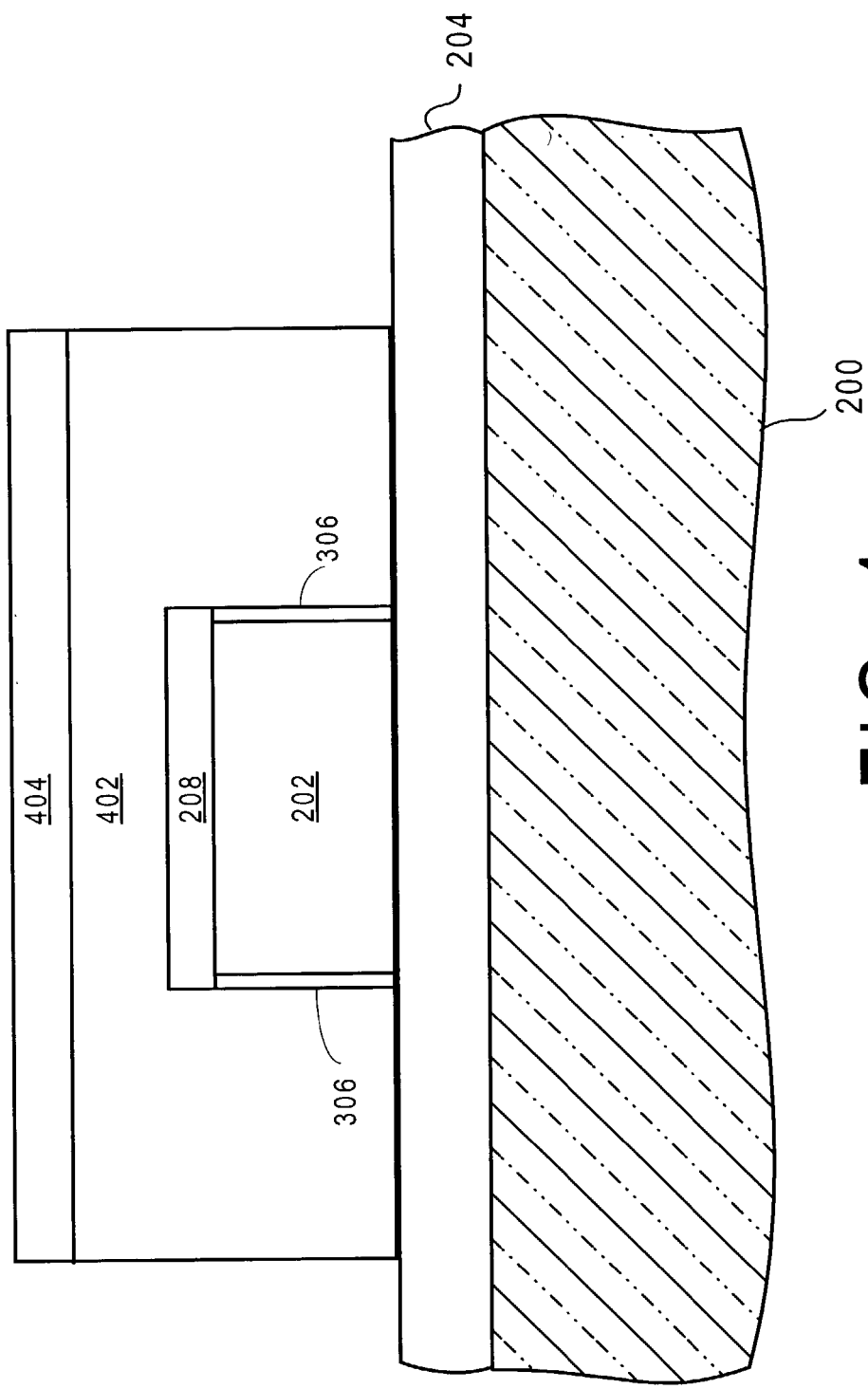

FIG. 4 diagrams some results of growing a gate oxide 306, depositing gate material 402, and depositing a gate hardmask 404 as part of step 114 (FIG. 1B). The view of FIG. 4 is a vertical section through the portion of gate material 402 that will ultimately become the gate structure: the portion over the middle of the mesa. The gate material 402 completely surrounds and covers the mesa 202, 208, and 306. The gate hardmask 404 covers the gate material 402. The gate material 402 may be polysilicon. This step also deposits gate material 402 and hardmask 404 on the fin structures on the same chip.

Figure 5:
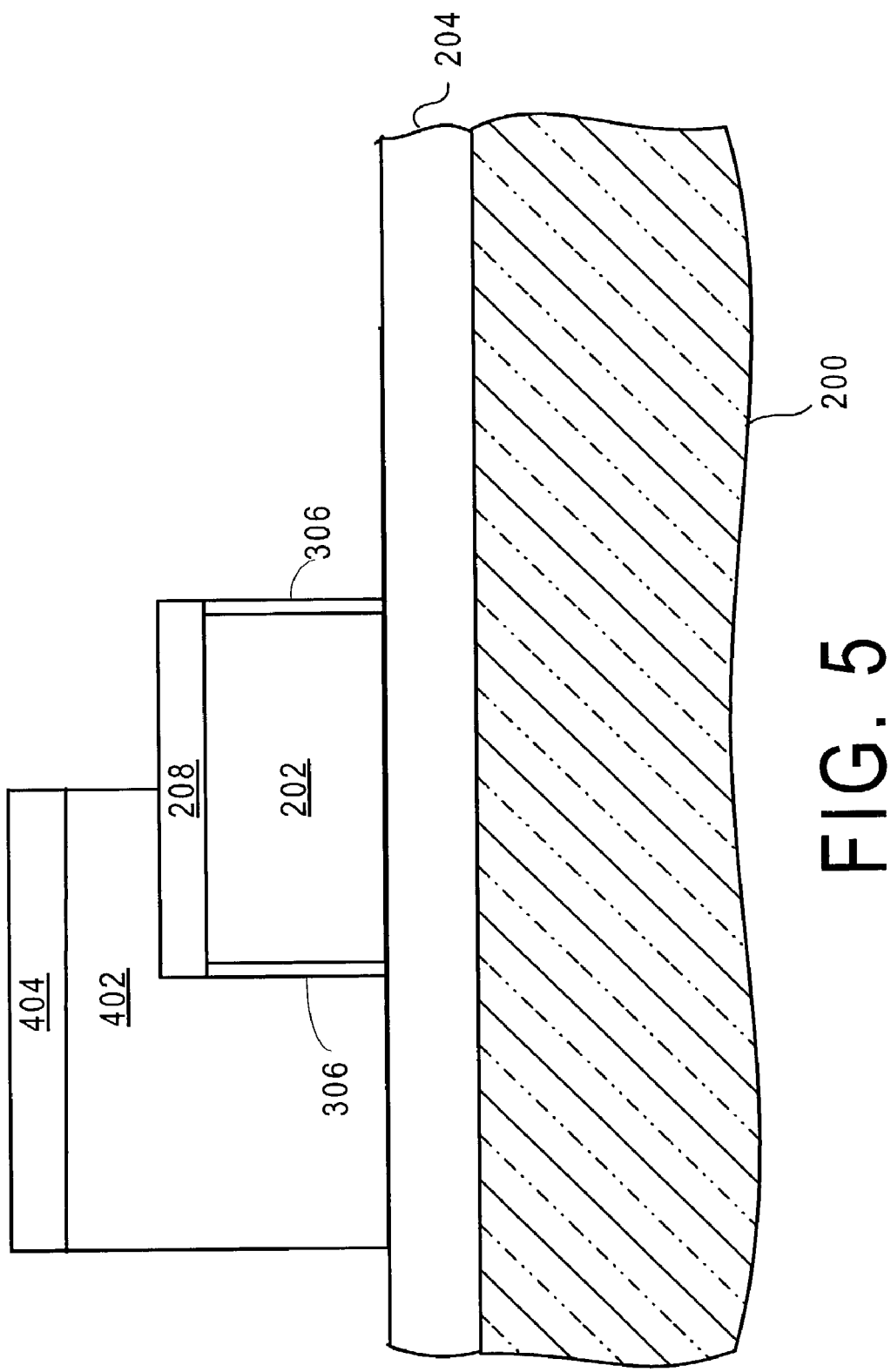

FIG. 5 shows some results of patterning the gate hardmask 404, opening the hardmask 404, and etching the gate 402. The view of FIG. 5 is a vertical section through the gate centerline. The resulting gate 402 contacts the active sidewall of the mesa midway between the ends, thereby dividing the active sidewall into source and drain regions. A portion of the gate material 402 extends away from the mesa 202, 208, and 306 on the buried oxide 204 to provide a connection point for the gate electrical contact. A portion of the gate 402 extends over the top of the mesa 208. The process concurrently forms gates for the fins located elsewhere on the chip: gate material 402 is patterned and etched to remain in contact with the gate oxide on both sides of the fin (not shown, but same materials as 202 and 306). The fin gate material 402 is continuous over the top layer (same material as 208) of the fin, and gate material 402 contacts the buried oxide 204 on both sides of the fin. The formation of gate structures on the mesas and fins completes step 114 (FIG. 1B)

Figure 6:
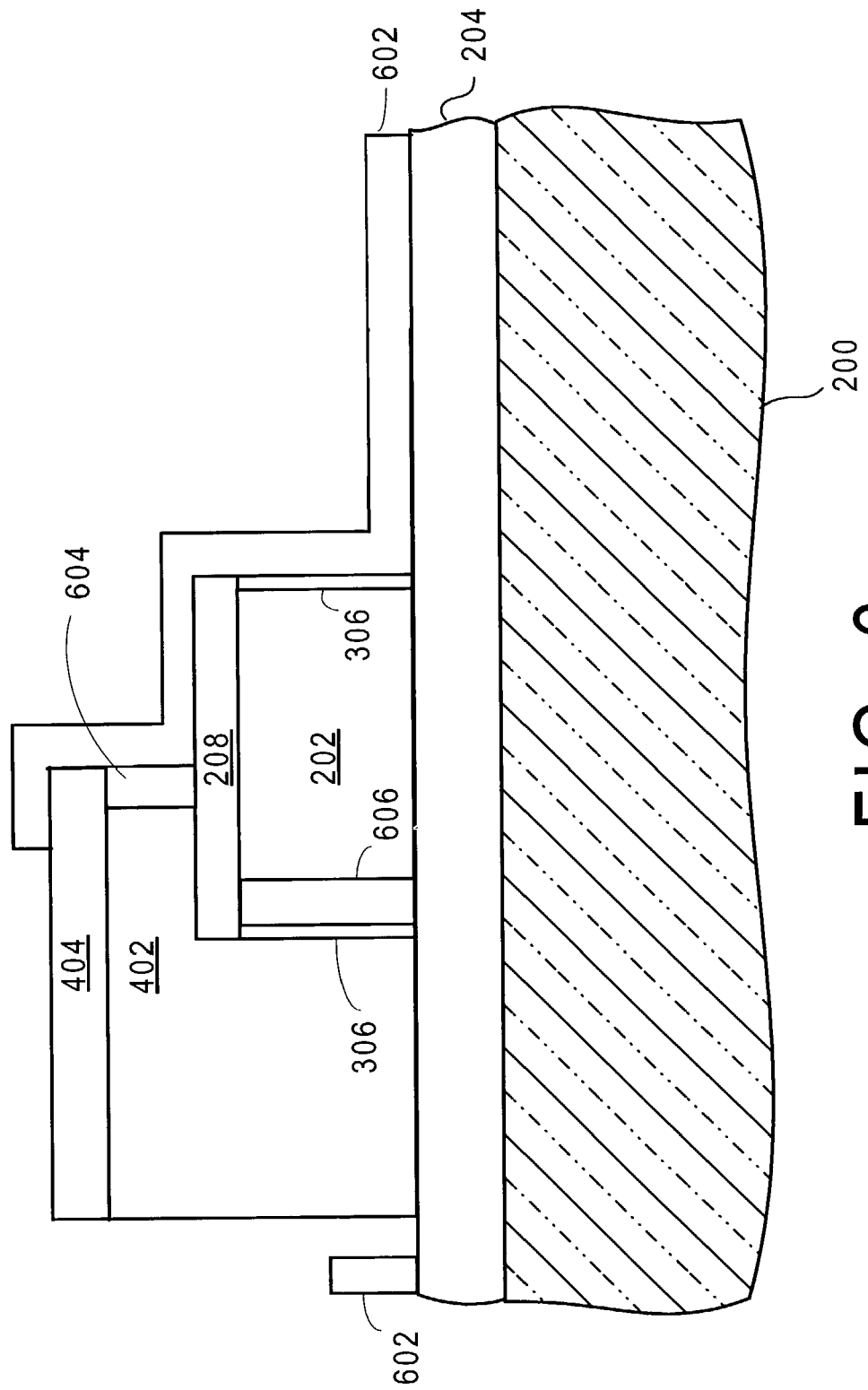

FIG. 6 shows some results of depositing a resist implant mask 602 and some results of N+ ion implantation as part of step 118 (FIG. 1B). The angle of the ion implantation is from the upper left in the vertical section view given in FIG. 6. The vertical section view of the gate 402, gate oxide 306, gate hardmask 404, and resist mask 602 is through the gate centerline. The vertical section view through the mesa is in a plane nearer the observer and not through the gate. Ion implantation changes most of the gate material to N+ polysilicon 402. A portion of the gate material 604 is typically not reached by the ion implantation. Portion 604 may be implanted in some embodiments. The mask 602 for the N+ ion implantation of sources 606, drains 607 (see FIG. 9B) and gates 402 also opens the body contacts of P-FET devices to N+ ion implantation. In an embodiment, source 606 and drain 607 (see FIG. 9B) regions are formed (step 118 FIG. 1B) by the same N+ ion implantation step which dopes the gate 402. The process concurrently dopes the sources, drains, and gates of N-FinFETs: the resist implant mask 602, which also covers the fins, is open to the gate material 402 on both sides of the fins. Consequently, the same doping process does not create undoped regions like 604 over the fins. The doping 118 (FIG. 1B) that creates source 606 and drain 607 (See FIG. 9B) regions in the mesa creates source and drain regions completely through the fins in the source and drain ends of the fins. The source and drain ends of the fin are separated by the fin gate.

Figure 7:
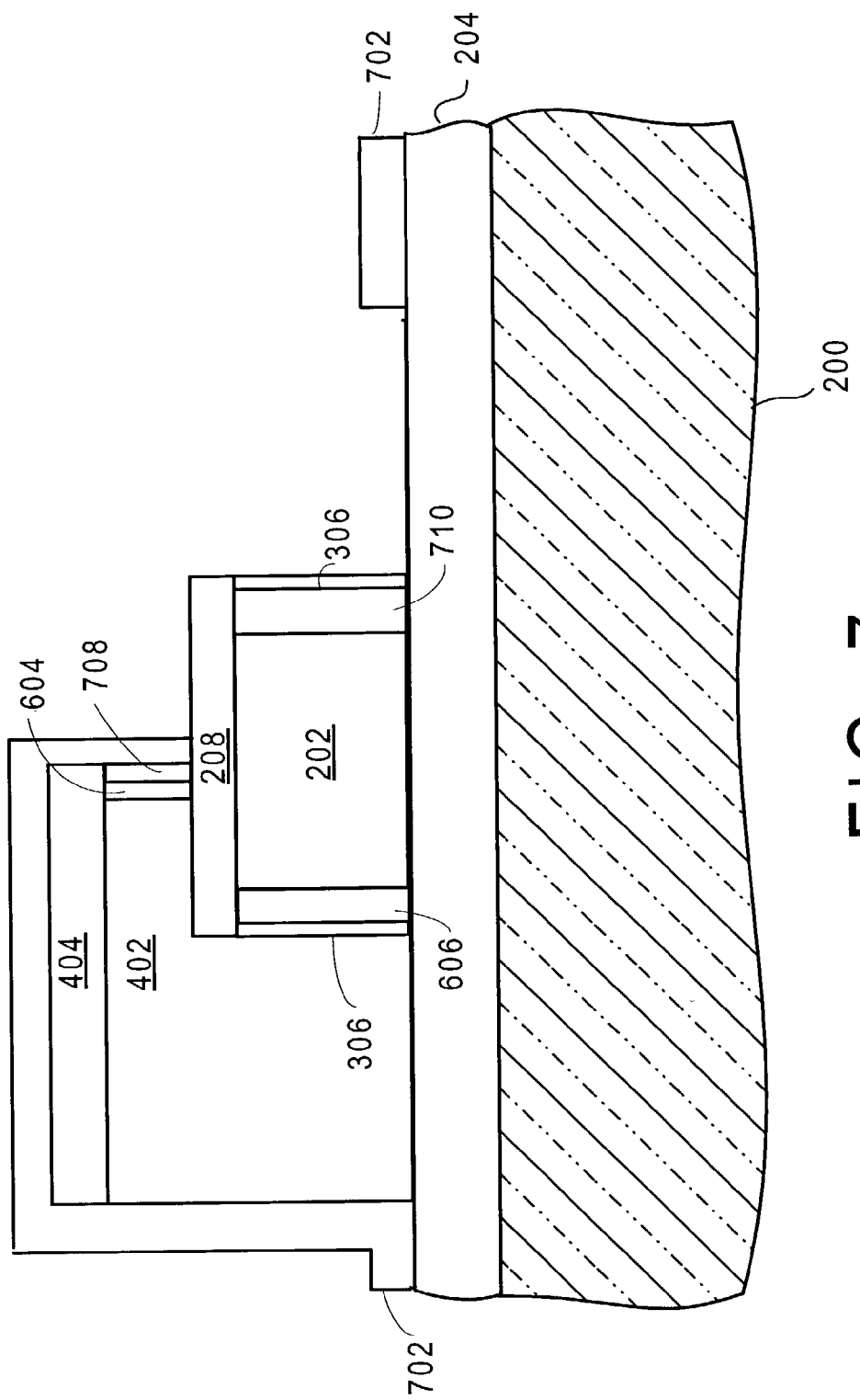

FIG. 7 shows the result of removing the resist implant mask 602 (FIG. 6), depositing a new resist implant mask 702, and implanting P+ ions from the upper right, as viewed in FIG. 7. Ion-implantation changes a portion of the P− silicon mesa body 202 into a P+ silicon body contact 710. In an embodiment, the mask 702 descends over region 604 to cover a portion of hardmask cap 208, as shown in FIG. 7. In another embodiment, mask 702 ends at the right-hand edge of the gate hardmask 404. In this embodiment, a small portion of gate material 604 is unavoidably doped to become P+ gate material 708. The mask 702 for the P+ ion implantation step 122 (FIG. 1B) of the body contact 710 is also open to the sources, drains, and gates of P-FET devices. The N-FinFETs may be masked by the resist implant mask 702 during this step. The N-FinFETs usually do not have body contacts 710. In an alternate embodiment in which at least one FinFET does have a body contact, the FinFET body contact may be doped concurrently with the body contacts of the thick-body devices.

Figure 8:
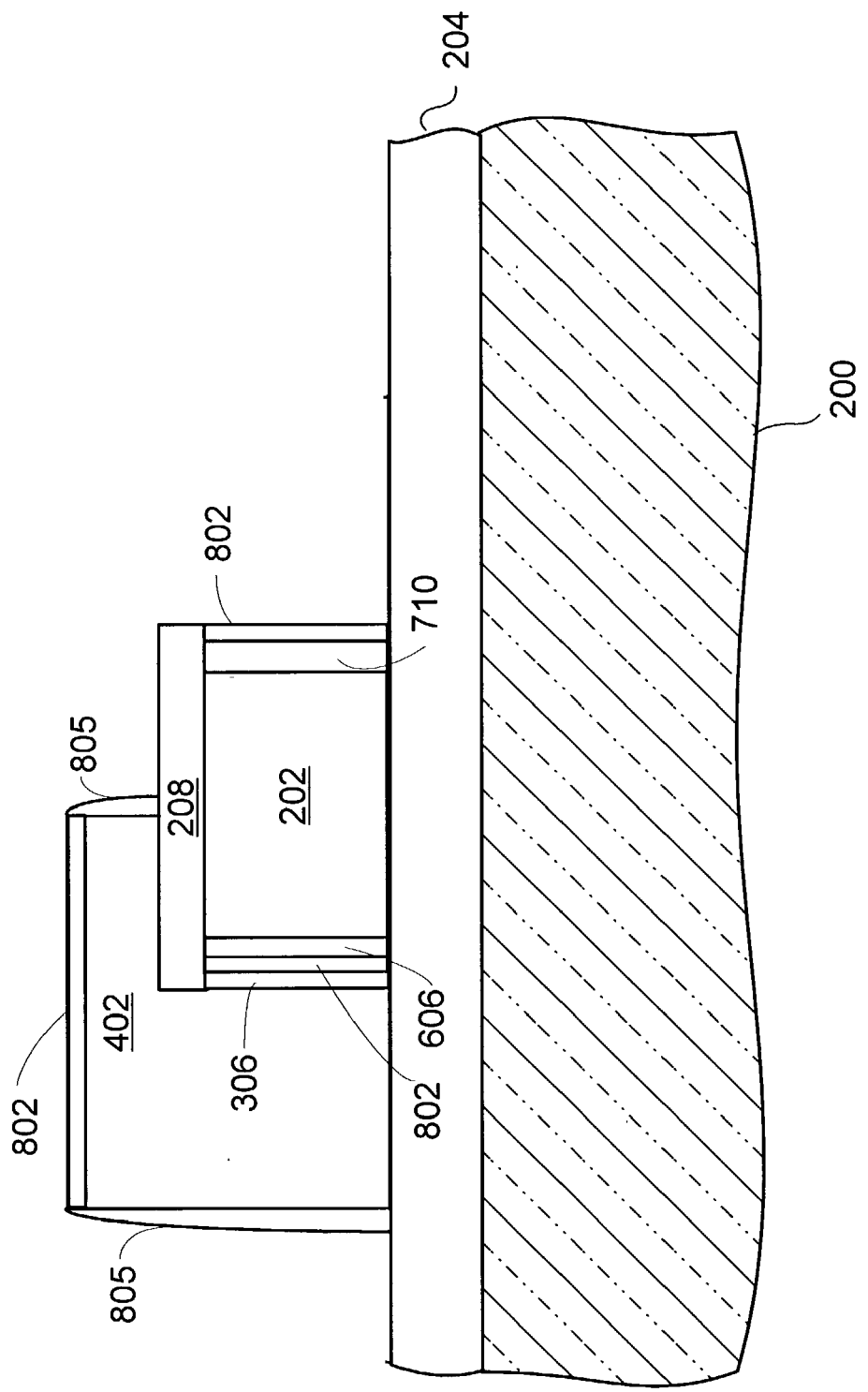

FIG. 8 shows some results of beginning step 124 (FIG. 1B) comprising removing the resist implant mask 702 (FIG. 7), removing the gate hard mask 404, creating sidewall spacers 805 on the gate 402, and then growing a silicide layer 802 on the exposed silicon of the gate 402, the source 606 and drain 607 (see FIG. 9B) regions, and the body contact 710. Exposed portions of gate oxide 306 are consumed in this process, as is the P+ gate material 708 and perhaps the un-doped gate material 604. Silicide is also grown on the fins located elsewhere on the chip. The silicide growth process consumes some of the silicon of the mesa 710 and 606 and of the gate 402 in the thick-body device, and some of the fin and gate in the FinFETs. The formation of the silicide layer is a preliminary sub-step of step 124 (FIG. 1B)

Figure 9A:
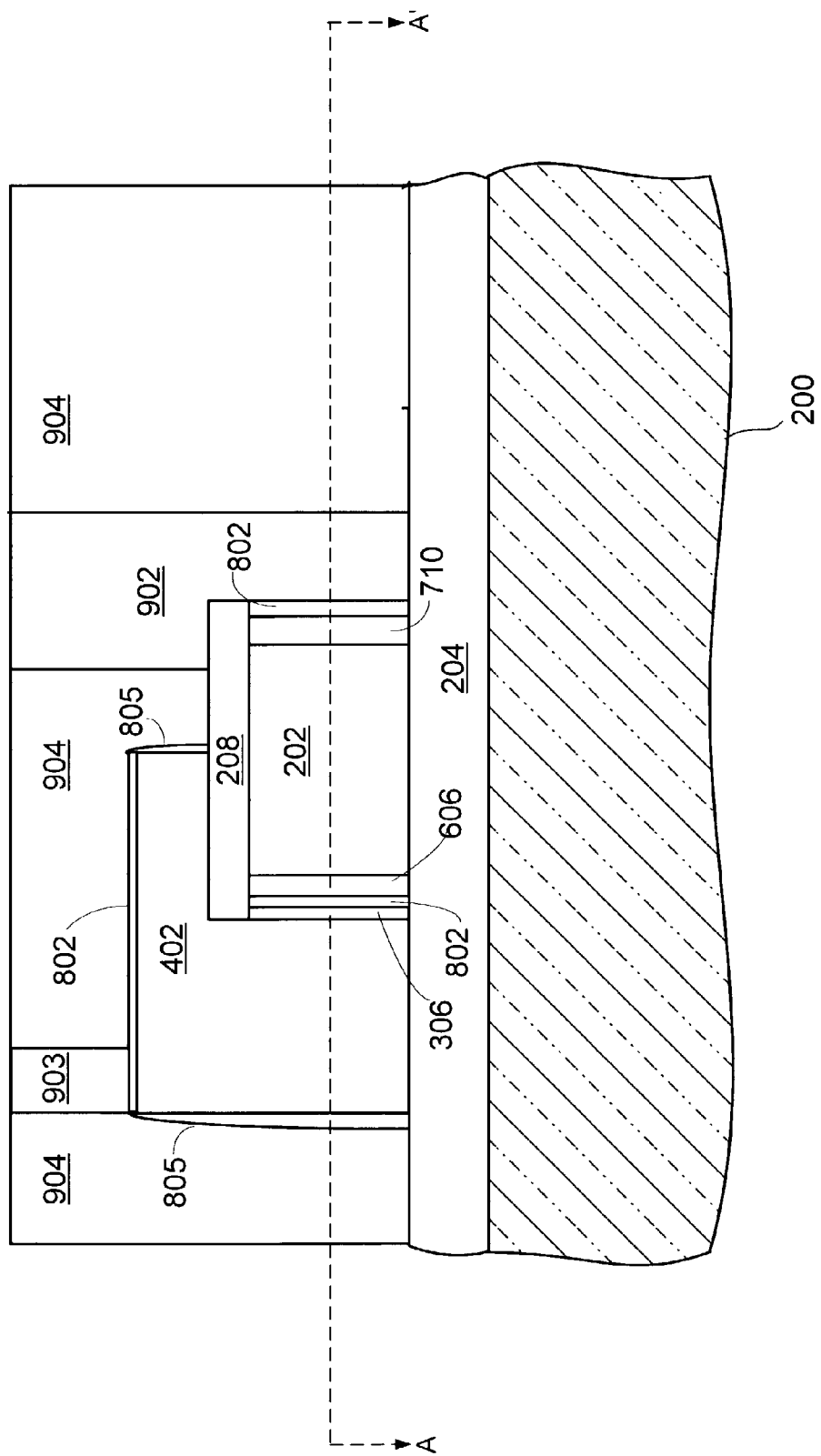
FIG. 9A shows an example of some results of the steps of encasing the device in an oxide, planarizing the encasing oxide, patterning and etching the planarized oxide to form holes for electrical contacts, and filling the holes with electrical contact material, as viewed in two vertical sections: one through the gate (for the gate, gate oxide, electrical contacts, and encasing oxide,) and another nearer plane through the source region of the mesa (within the mesa)

FIG. 9A shows some further results of step 124 (FIG. 1B), further comprising encasing the thick-body device in oxide 904, planarizing the oxide 904, patterning and etching the oxide 904 to form holes for electrical contacts 902 and 903, and then forming the electrical contacts 902, 903, 1002 (FIG. 9B) and 1004 (FIG. 9B) to the body contact 710, the gate 402, the source 606, and the drain 607 (FIG. 9B), respectively. In most embodiments, the electrical contacts 902, 903, 1002, and 1004 are made of metal. The silicide layer 802 between the electrical contacts 903 and 904 and the gate 402 and body contact 710, respectively, provide ohmic connections between the metal electrical contacts and the semiconductor material. FIG. 9A has a sectional viewing plane (A–A') defined for use in FIG. 9B. Electrical contacts are formed concurrently for the fins' sources, drains, and gates and, in an alternate embodiment, fin body contacts. The FinFETs do not usually have body contacts 710. In embodiments of an apparatus comprising FinFETs with body contacts, the electrical connections thereto would also be formed in step 124 (FIG. 1B).

FIG. 9B shows the plan view defined by plane A–A' in FIG. 9A. The thick-body device shown by example, other thick-body devices concurrently formed, and the concurrently formed fins are encased in an insulating oxide 904. The body of the transistor 202 is contacted along its length by body contact 710 which is connected electrically through the silicide layer 802 to the body electrical contact 902. The source and drain regions 607 and 606 are doped regions in the body 202 and have silicide 802 grown on their surfaces as ohmic connections to the drain electrical contact 1004 and the source electrical contact 1002. The gate oxide 306 that is covered by the gate survived the silicide 802 formation process. The gate 402 makes ohmic contact with the body 202 through the gate oxide 306. The gate 402 has undergone dimensional reduction due to the formation of the silicide 802. Gate electrical contact 903 connects through the silicide layer 802 in a plane below section plane A–A'.

Figure 10:
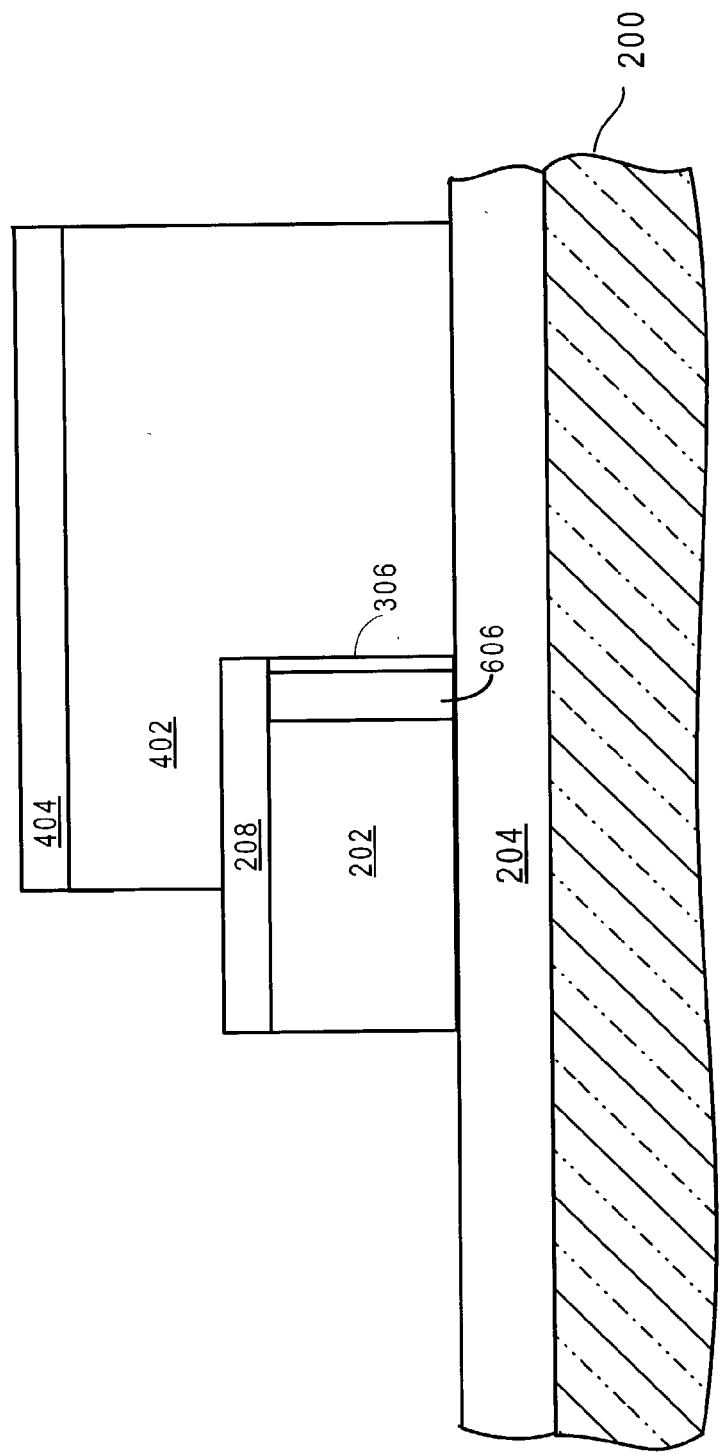

In an alternate embodiment, the body electrical contact 902 is formed through the top of the mesa. In FIG. 10, which illustrates the result of a step in this alternate embodiment, we take up where FIG. 4 of the original embodiment left off. FIG. 10 is a vertical section view through the centerline of the gate. In this alternate embodiment, the gate material 402 and the gate hardmask 404 are patterned and etched to extend over the mesa 202 and 208. The N+ ion implantation doping of the gate material 402, source 606 (shown, in a plane nearer the viewer than the gate center line) and drain 607 (not shown) (step 118 of FIG. 1B), and the P+ ion implantation doping of the mesa 202 (step 122 of FIG. 1B) then proceed as in the original embodiment but from opposite sides in the view of FIG. 10.

Figure 11:
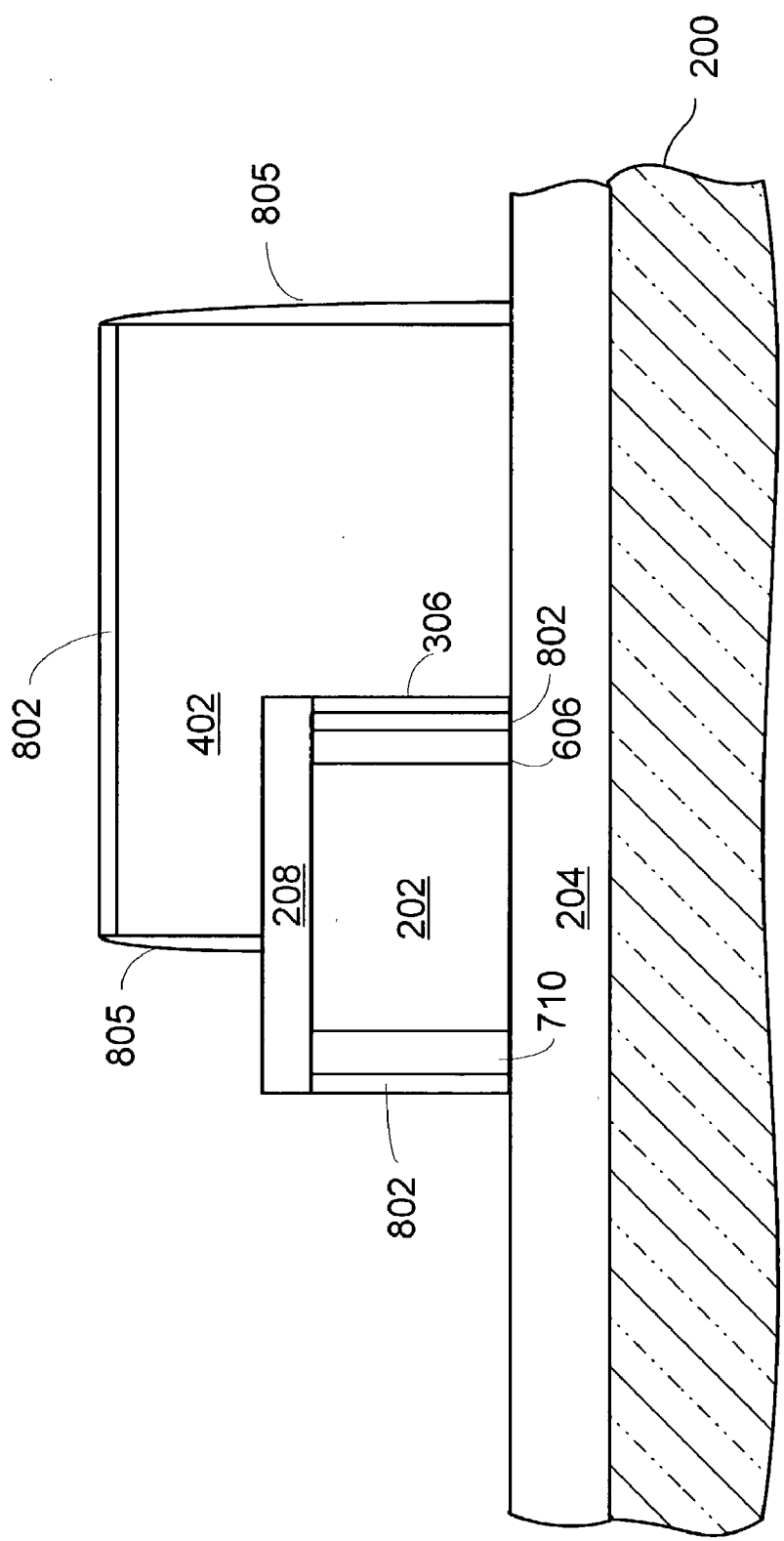

FIG. 11 shows the result of P+ doping the mesa (step 122 of FIG. 1B). The P+ doping forms the body contact 710 which contacts the body 202 on the side of the body 202 opposite the active sidewall. Sidewall spacers 805 are then formed on the vertical surfaces of the gate 402. Next, a suicide layer 802 is formed over the exposed silicon surfaces on the thick-body device as shown as well as over the FinFETs and additional thick-body devices not shown in FIG. 11. Note that the mesa hardmask 208 is not consumed by the silicide 802 growth process. A portion of the gate oxide 306 which survived the silicide 802 formation process remains between the gate and the body 202, but is not significantly present elsewhere on mesa. In an embodiment, this step 185 (FIG. 1E) concurrently dopes the sources and drains of P-FETs elsewhere on the chip. In another embodiment, this step 122 (FIG. 1B) concurrently dopes the sources and drains and gates of P-FETs elsewhere on the chip.

Figure 12A:
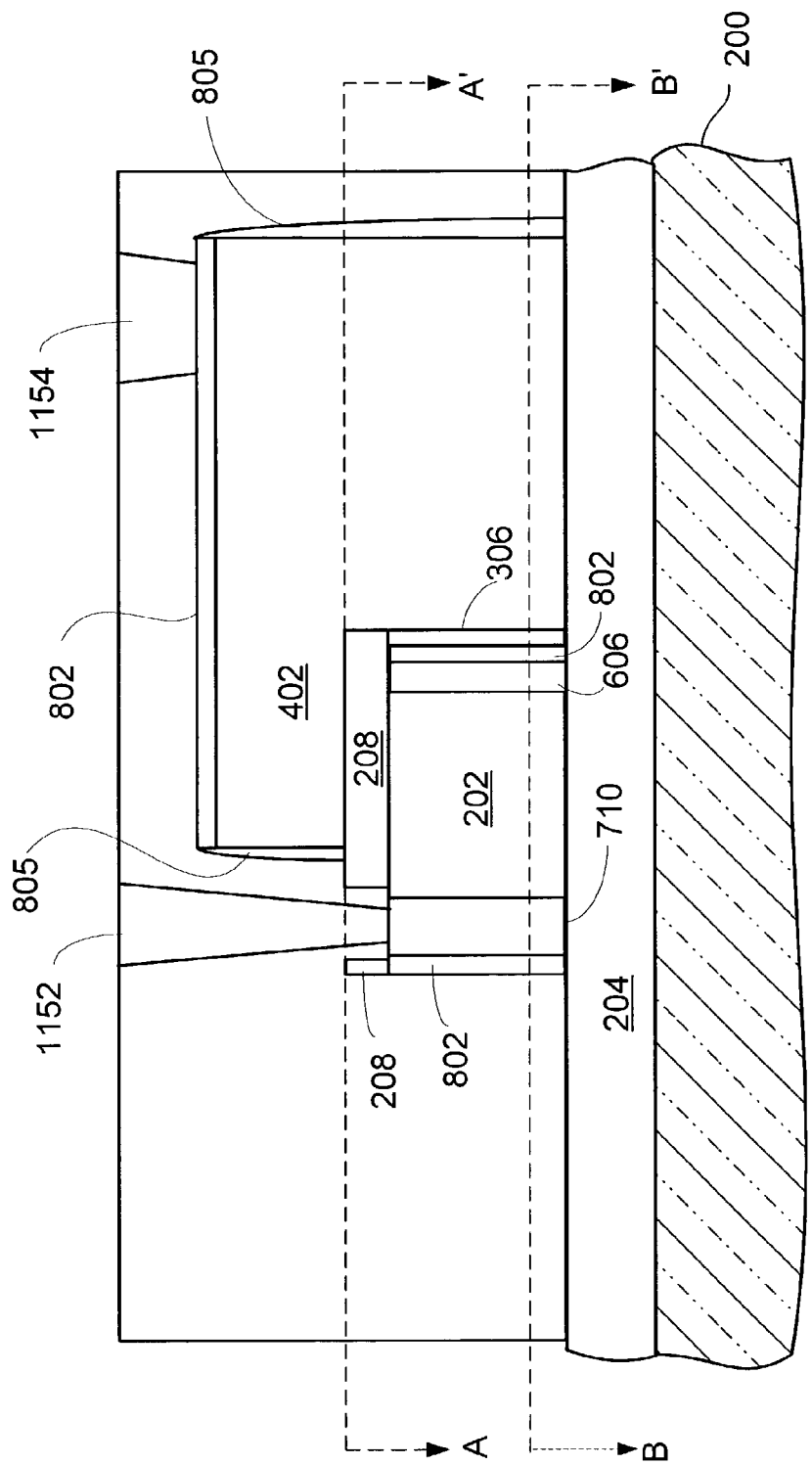
FIG. 12A shows an example of some results of the steps of patterning the mesa hardmask and etching through the mesa hardmask to the body contact, encasing the device in oxide, patterning and etching the oxide to form holes for electrical contacts, and filling the holes with electrical contact material.
Figure 12B:
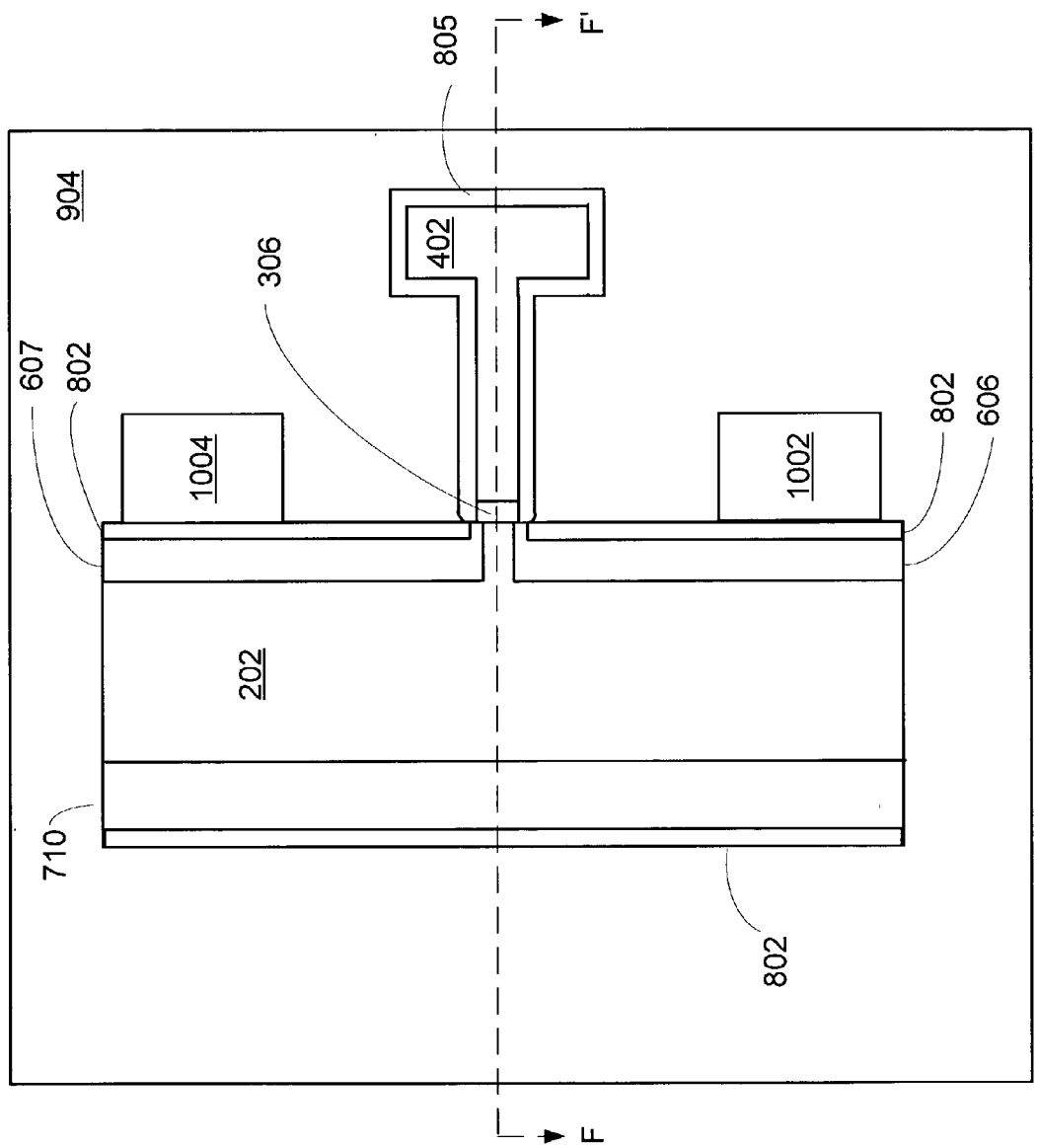
FIG. 12B is a view of horizontal section B–B' as defined in FIG. 12A.

FIG. 12A shows the device of FIG. 11 encased in planarized oxide 904. The planarized oxide 904 has been patterned and etched to form holes for electrical contacts 1152, 1154, 1002 (FIG. 12B), and 1004 (FIG. 12B). Note that the etching for the body contact electrical contact 1152 penetrates the mesa hardmask 208 to reach the body contact 710. The etched holes have been filled with tungsten or other suitable conductor to form electrical contacts 1152, 1154, 1002 (FIG. 12B), and 1004 (FIG. 12B). The body contact electrical contact 1152 and the gate electrical contact 1154 are illustrated in FIG. 12A. The formation of the electrical contacts 1152, 1154, 1002 (FIG. 12B), and 1004 (FIG. 12B) completes step 187 (FIG. 1E). Two horizontal sections are defined in FIG. 12A as A–A' and B–B'.

FIG. 12B shows the B–B' horizontal section defined in FIG. 11B with electrical contacts for the source 1004 and drain 1002 added. Silicide layer 802 provides an ohmic contact for the source 607 and drain 606 regions to their electrical contacts 1004 and 1002. A widened portion of the gate 402 over the buried oxide serves as the connection point for the gate electrical contact (above this section plane). The thin portion of gate material 402 between the widened portion and the gate oxide 306 may be of minimum lithographic dimension or less. This same width of gate material 402 makes contact up the vertical face of the active sidewall of the mesa (on the right, in the view of FIG. 12B). The body contact 710 contacts the body 202 along its length and height. Source 607 and drain 606 regions have been doped into the body 202 and a silicide layer 802 grown into the source 607 and drain 606. FIG. 12B defines vertical section plane F–F' which is the section plane of FIG. 12A.

Figure 12C:
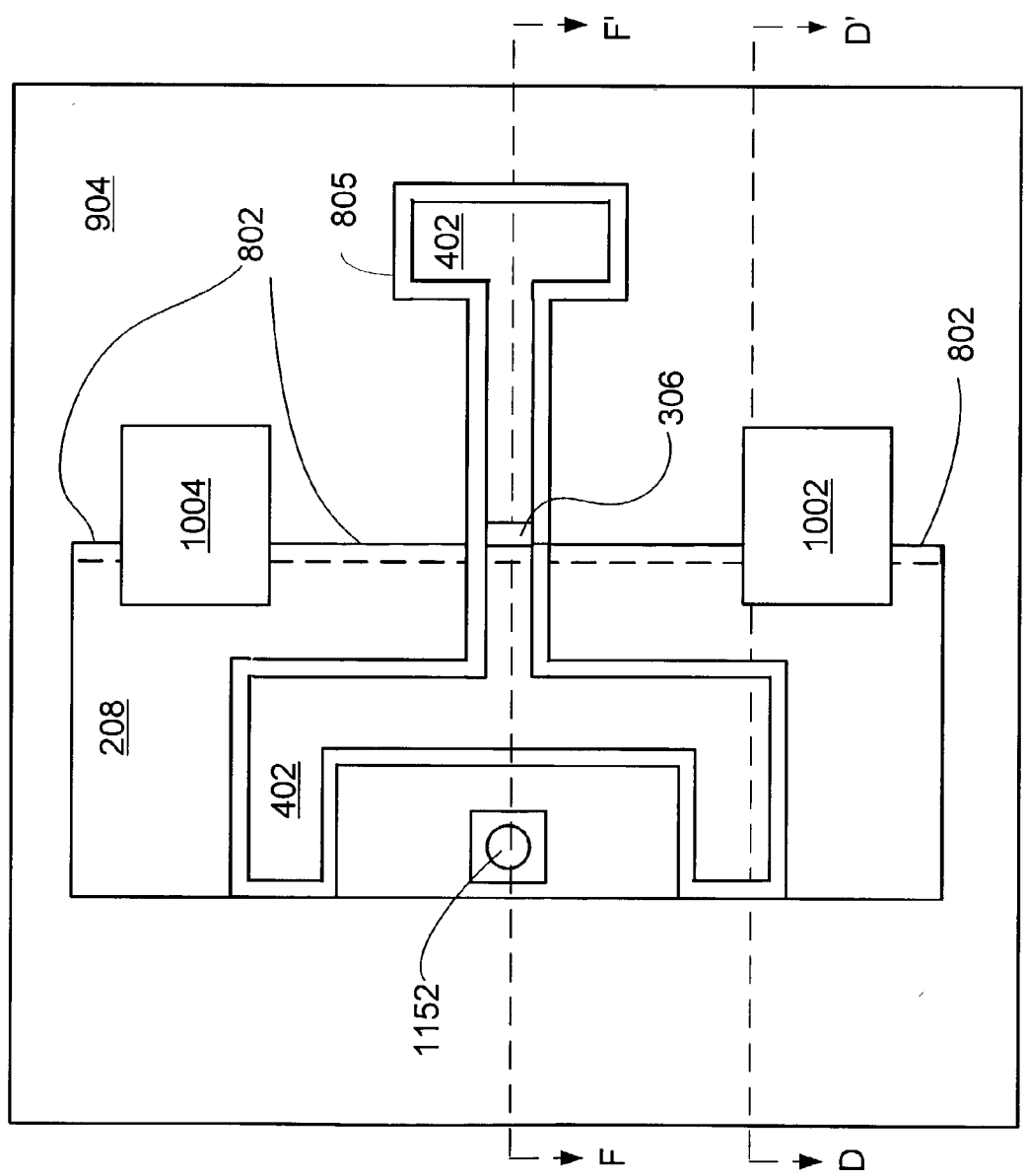
FIG. 12C is a view of horizontal section A–A' as defined in FIG. 12A.

FIG. 12C shows horizontal section A–A' as defined in FIG. 12A with electrical contacts 1002, 1004, 1152, and 1154 for the drain, source, body contact, and gate contact, respectively. Note that the gate has been formed to divide the mesa top into three regions corresponding to electrical contacts for the source 1004, drain 1002, and body contact 1152. Sidewall spacers 805 are formed on the vertical surfaces of the gate 402. Silicide 802 is formed on the exposed silicon surfaces of the gate structure 402, the mesa active sidewall 606 and 607 (hidden in FIG. 12C and denoted by dashed vertical line along right-hand side of mesa; shown in FIG. 12B), and the body contact 710 sidewall (FIG. 12B) Source and drain electrical contacts 1004 and 1002 make an ohmic connection to their respective regions through silicide 802.

Figure 12D:
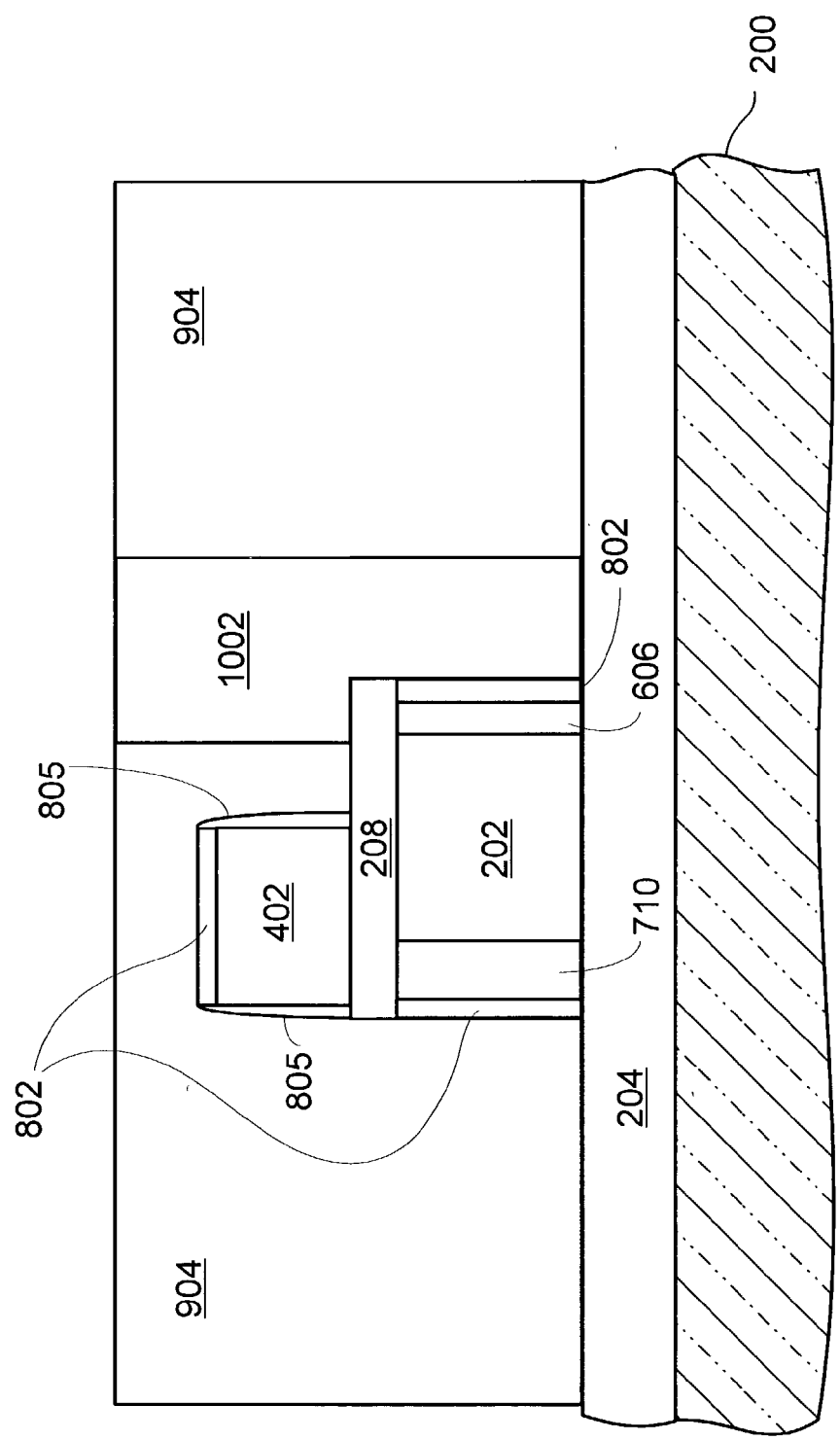
FIG. 12D is a view of horizontal section D–D' as defined in FIG. 12C.

The device is encased in oxide 904 which is planarized, patterned, and etched to form holes for electrical contacts 1152, 1002, 1004, and 1154. To make the body electrical contact 1152, the mesa hardmask 208 is patterned and etched to deepen the body electrical contact hole in the oxide 904 and etch down to the body contact 710 (below the horizontal section plane of FIG. 12C). The portion of body contact 710 exposed by the hole is doped to provide an ohmic connection for the electrical contact 1152. The hole is then filled with metal to form the electrical contact 1152. Holes in the insulating encasing oxide 904 for the sources drains, and gates, and for the electrical contacts for the other thick-body devices and for the fins are patterned in a sub-step of step 124 (FIG. 1B) and etched in a sub-step of step 124 (FIG. 1B). FIG. 12C defines two vertical section planes: D–D' and E–E'. Plane E–E' is the plane viewed in FIG. 12A. Plane D–D' is the plane viewed in FIG. 12D. FIG. 12D shows the doping interior to the mesa in detail. The body contact 710 may be created by ion-implantation doping from the upper left, in the view of FIG. 12D. Drain region 606 may be formed by ion implantation doping from the upper right, in the view of FIG. 12D. Silicide 802 is grown after ion implantation of the source 607 (FIG. 12B) drain 606, and the gate 402. After the silicide 802 is grown, oxide 904 is deposited, planarized, and etched to form holes for electrical contact 1002, as well as electrical contacts 1004, 1152, and 1154 (FIG. 12C). The hole is filled with electrical contact material such as tungsten or other metal to form the electrical contact 1002 for the source 606. Electrical contact 1002 has an ohmic electrical connection with the source 606 through the silicide layer 802.

Figure 13:
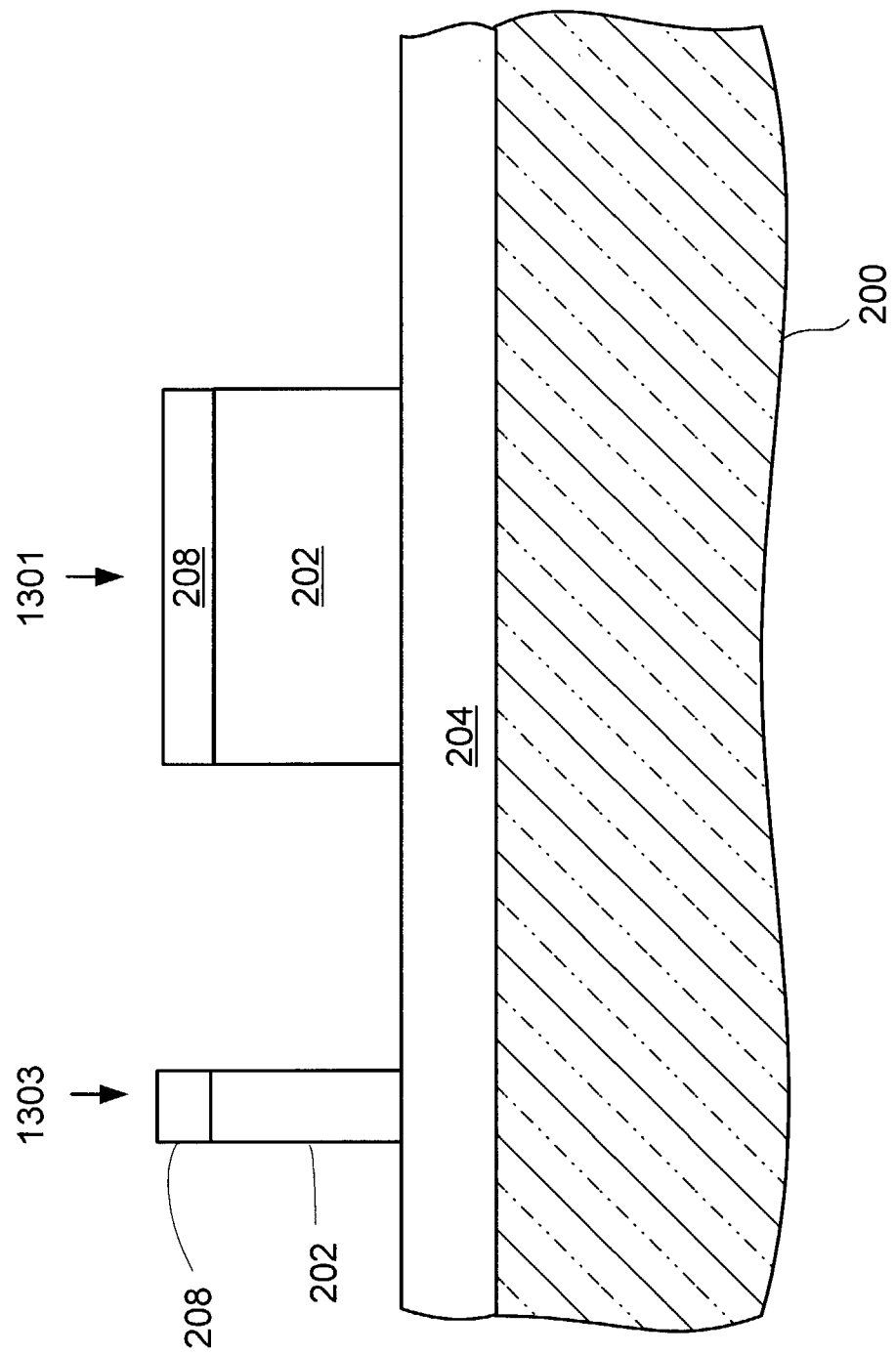
FIGS. 13–18 are views of an exemplary fin FET and an exemplary planer mesa FET during the steps of fabrication of an embodiment of the invention.

In an exemplary embodiment of the process 170 (FIG. 1D), a planar FET is formed on a mesa top concurrently with the formation of a FinFET elsewhere on the chip. FIG. 13 shows some results of patterning 171 (FIG. 1D) and etching 172 (FIG. 1D) an SOI substrate (200, 204, 202, and 208), such as the one shown in FIG. 2, to form a mesa 1301 and a fin 1303. Each has a remnant of hardmask 208 above a silicon body 202, on a base oxide 204 on a wafer 200.

Figure 14:
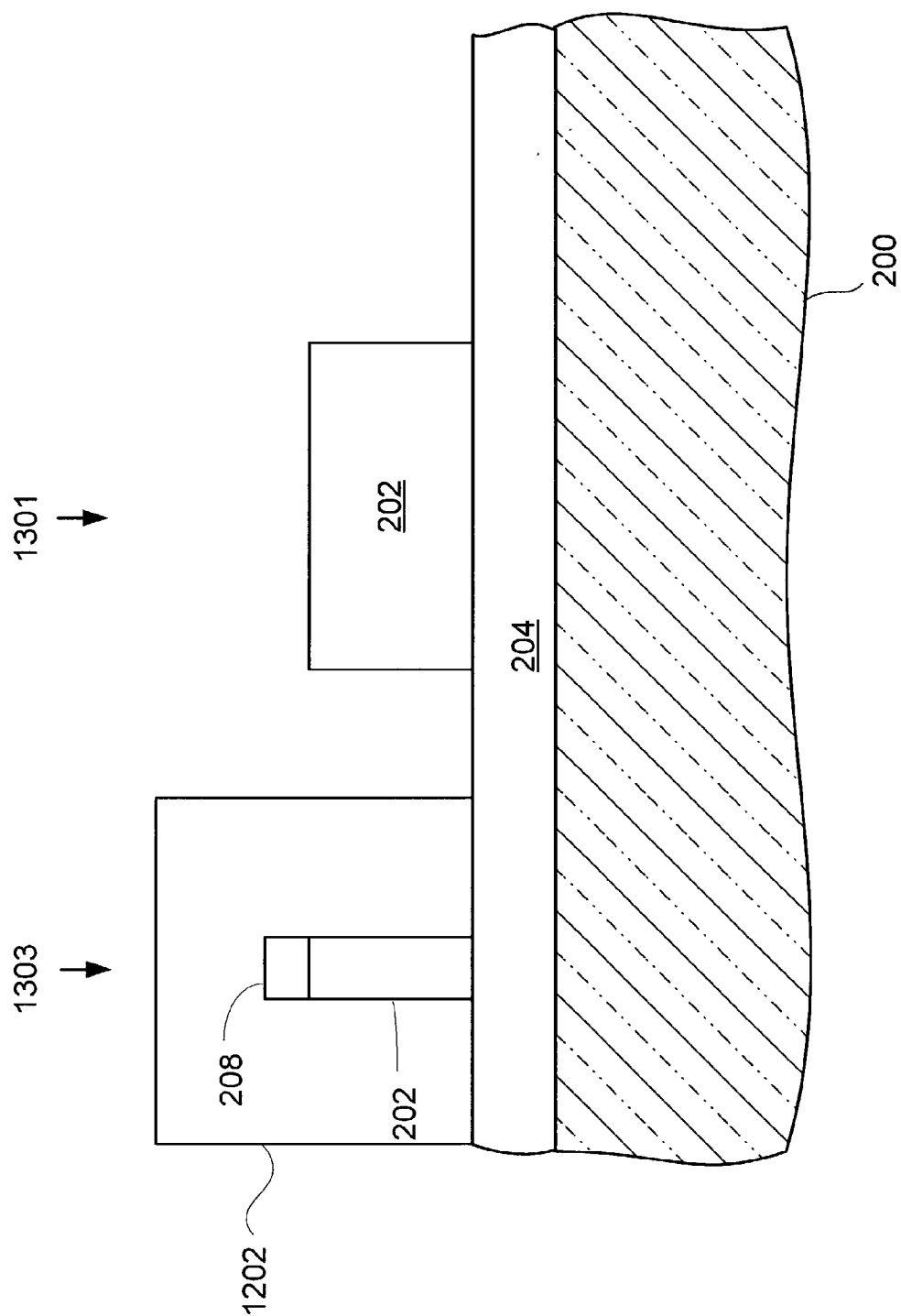

FIG. 14 shows further results of step 172 (FIG. 1D) of an exemplary embodiment of the process 170 (FIG. 1D) of encasing the fin 1303 in a block mask 1202 and selectively etching the hardmask 208 from the mesa 1301. This exposes the top surface of the mesa 202 upon which a planar FET will be formed. In embodiment 170 (FIG. 1D), step 172 (FIG. 1D) is completed when the block mask 1202 is stripped away.

In step 174 (FIG. 1D), the planar mesa FET 1301 is masked while gates are formed for at least one mesa sidewall FET device. In an alternate embodiment, the mask for step 174 (FIG. 1D) may include the block mask 1202.

Figure 15:
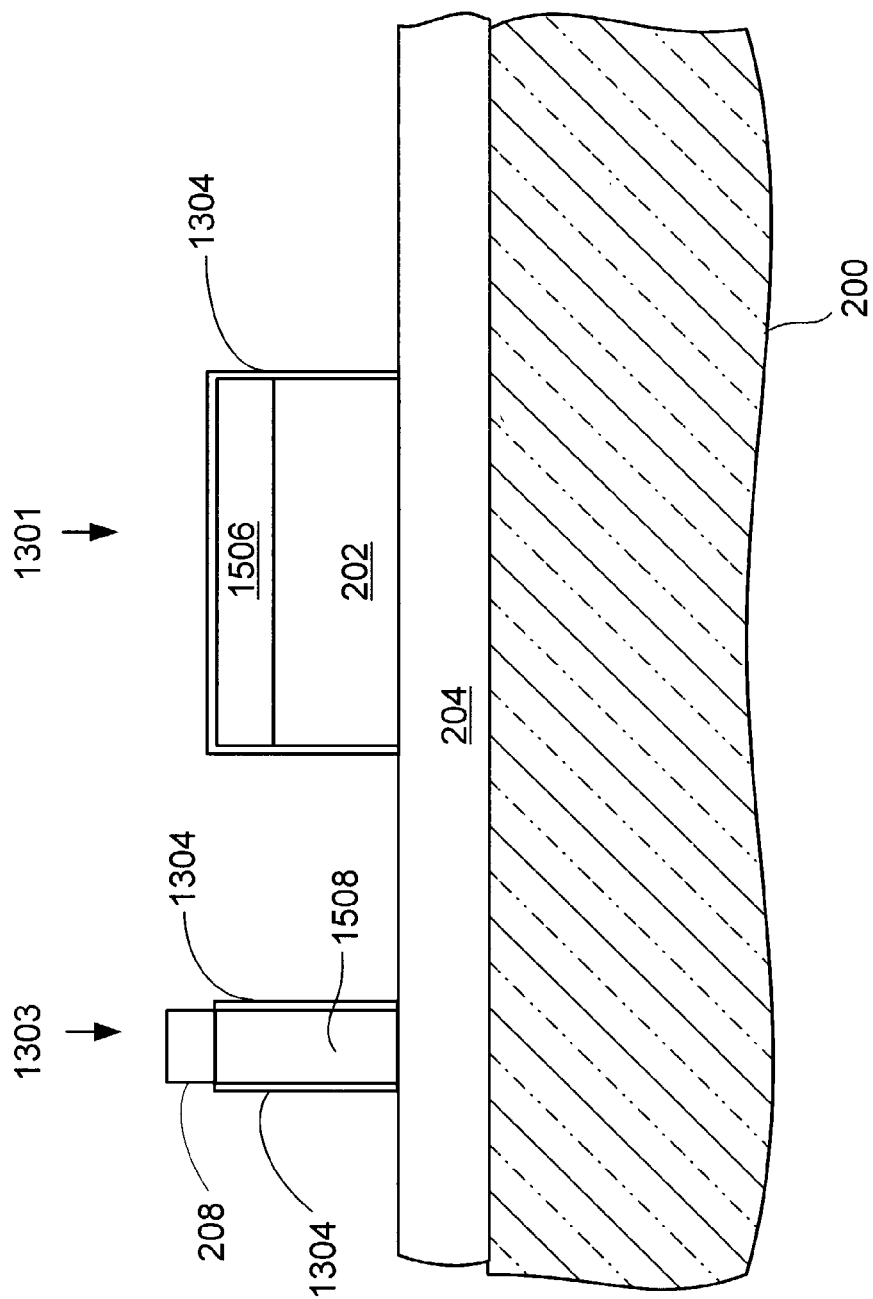

FIG. 15 shows some results of further steps of an exemplary embodiment of the process 170 (FIG. 1D) in a vertical section through the drain region of the mesa 1301 and the fin 1303. The further steps comprise stripping the block mask 1202 (FIG. 14) from the fin 1303 to complete step 172 (FIG. 1D), growing a sacrificial oxide (not shown) to begin steps 175 (FIG. 1D), ion-implanting the source (not shown) and drain 1506 region (step 175, FIG. 1D) on the mesa 1301 top and on the fin 1303 side 1508 through a block mask (not shown), stripping the sacrificial oxide (not shown) and growing a gate oxide 1304. The source and drain 1506 implants may be done concurrently on the fin 1303 and mesa 1301. In an embodiment of the method, the fin 1303 is masked for customized ion implantation of the mesa 1301 and then the mesa 1301 is masked for customized ion implantation of the fin 1303. In another embodiment of the method, the mesa 1301 is masked first while the fin 1303 is implanted and then the fin 1303 is masked while the mesa 1301 is implanted. In yet another embodiment, gates are formed for both the fin and the mesa-top planar FET before ion implantation. In a variation of that embodiment, the source, drain, and gate of the fin and mesa-top planar FET are doped through the same mask.

Figure 16:
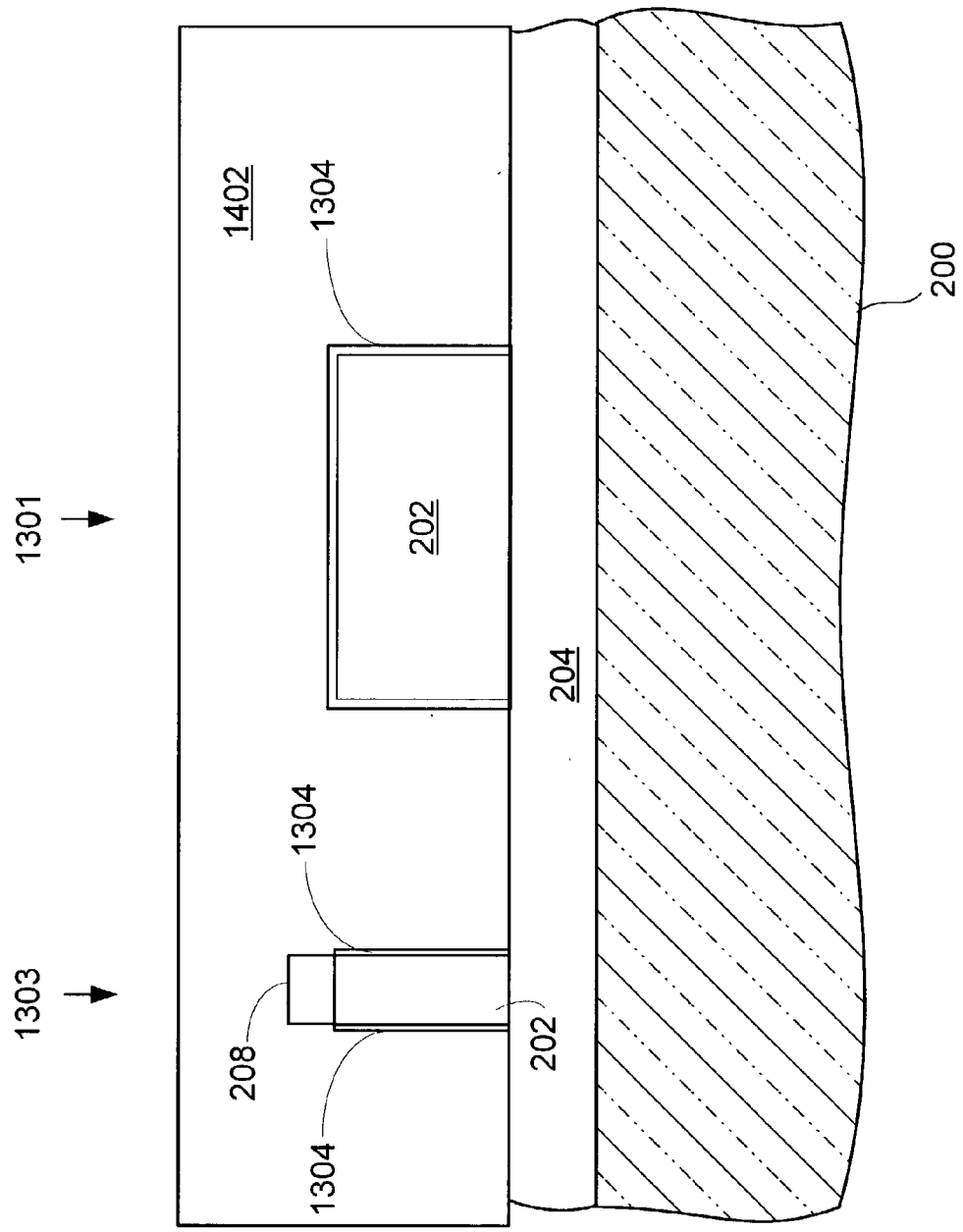

FIG. 16 shows the fin 1303 and mesa 1301 during step 177 (FIG. 1D) with the gate material 1402 deposited and planarized. The view of FIG. 16 is of a vertical section plane though what will become the centerline of the gate. Note that the fin 1303 retains its hardmask cap 208 and that the gate oxide 1304 covers both sides of the fin 1303 and the sides and the top of the mesa 1301.

Figure 17:
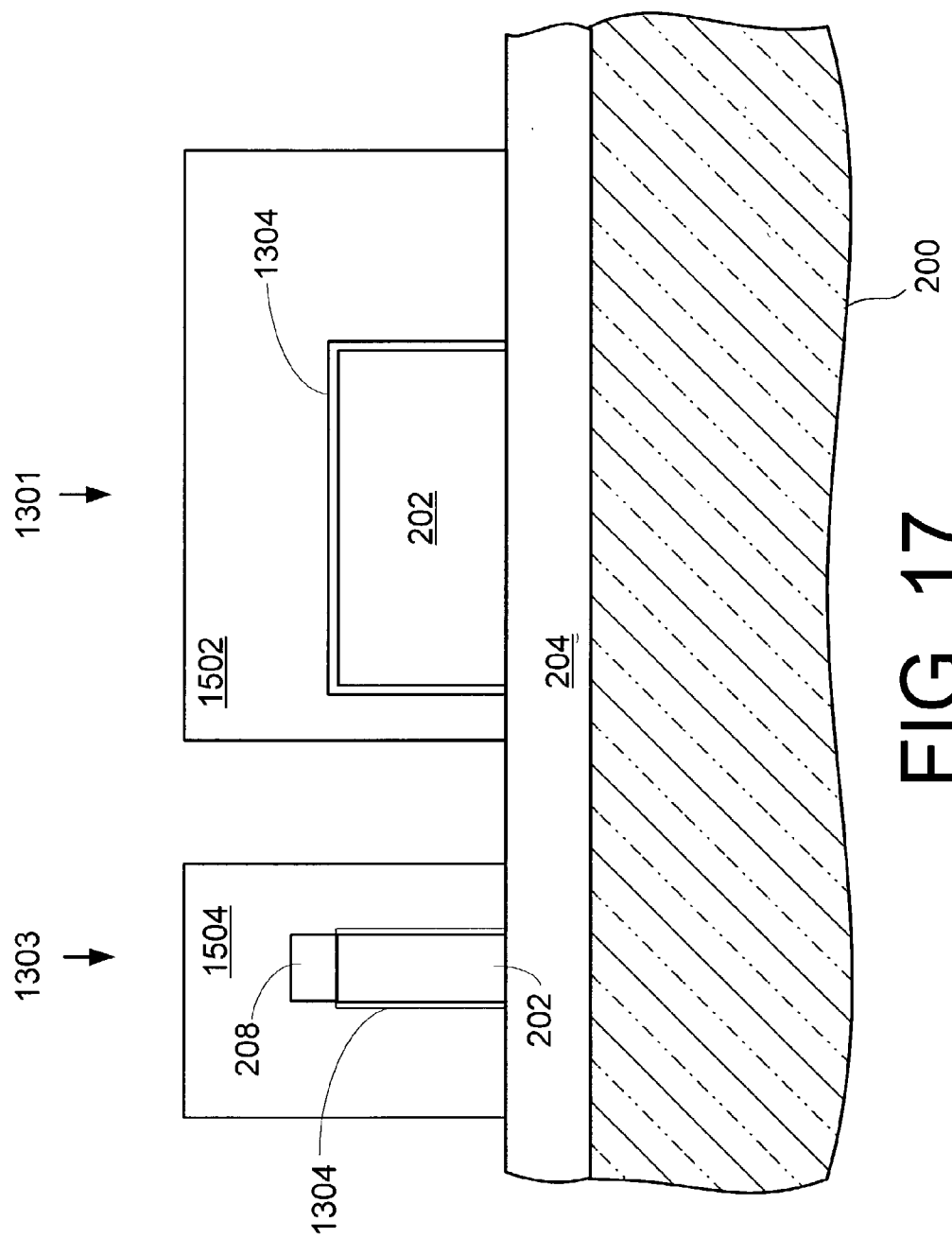

FIG. 17 shows the fin 1303 and mesa 1301 with patterned and etched gates 1504 and 1502, respectively. The etched gates 1502 and 1504 are thin structures generally perpendicular to the mesa and fin, respectively. FIG. 17 represents the completion of step 177 (FIG. 1D).

Figure 18:
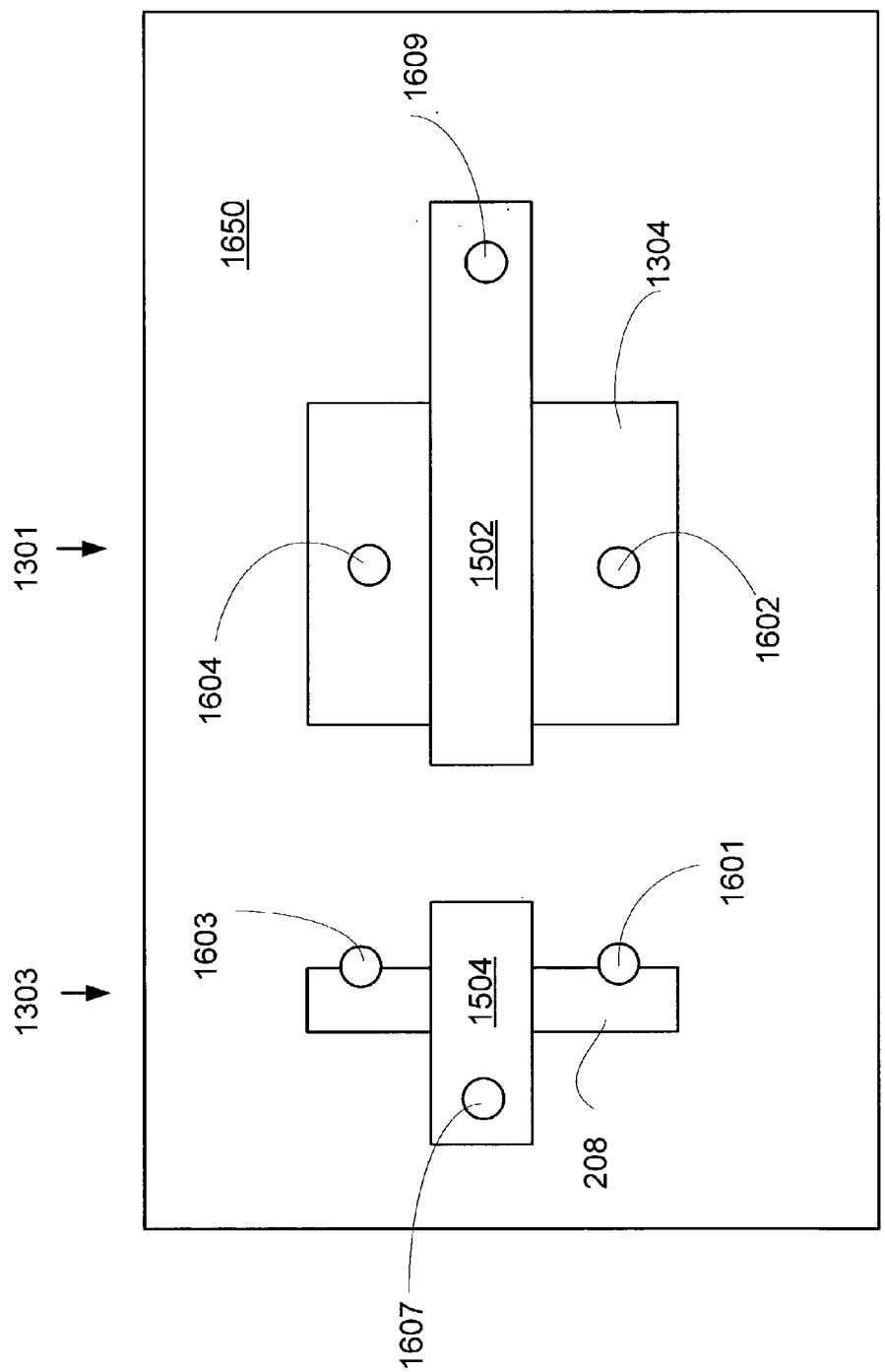

FIG. 18 shows a plan view of the fin 1303 and mesa 1301 showing the fin 1303 and mesa 1301 encased in oxide 1650. The oxide 1650 has been planarized, patterned and etched to form holes for the planar mesa FET source electrical contact 1604, planar mesa FET drain electrical contact 1602, the planar mesa FET gate electrical contact 1609, the FinFET gate electrical contact 1606, FinFET source electrical contact 1603, and the FinFET drain electrical contact 1601. The top of the mesa is covered in a gate oxide 1304 which is partially covered by the gate 1502. In another embodiment, exposed gate oxide layer 1304 is etched away to expose the body 202 (FIG. 17) prior to the deposition of the encasing oxide. The top of the fin 1303 is a remnant of the hardmask 208 that is original to the substrate. The hardmask remnant 208 is partially overlaid by the gate 1504. The extension of the mesa gate 1502 is to provide a connecting point for the gate electrical contact 1609. Likewise, the fin gate 1504 is extended outward from the body to provide a connecting point for the fin gate electrical contact 1607. FIG. 18 represents the completion of step 178 (FIG. 1D).

Figure 18A:
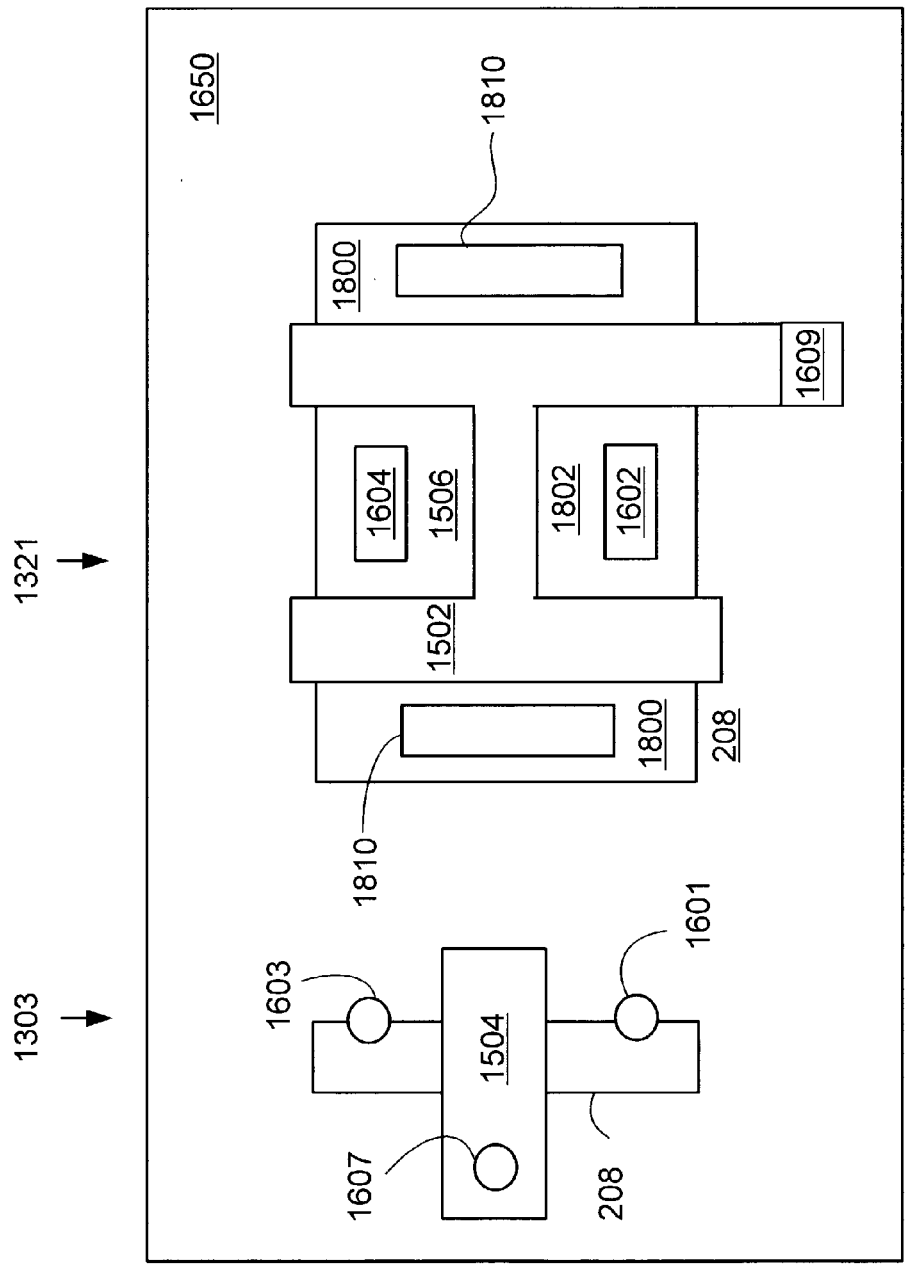
FIG. 18A shows a planar view of an example of some results of forming a planar mesa FET with body contacts concurrently with a fin FET.

In yet another exemplary embodiment of the process 180 (FIG. 1E), the gate for the mesa-top planar FET is formed before ion-implantation of the sources and drains. FIG. 18A shows a plan view of an exemplary embodiment of a mesa-top FET 1321 with body contacts 1800 and a concurrently formed FinFET 1303, all encased in oxide 1650. The gate 1502 is "H"-shaped to divide the top of the mesa into four regions. To the left and right of the gate 1502 side bars lie body contacts 1800. The gate 1502 is formed in step 183 (FIG. 1E), after steps 181 and 182 (FIG. 1E) as adapted to this embodiment 180. Step 183 (FIG. 1E) includes growing a gate oxide 1304 on the mesa top prior to deposition of the gate material. A portion of the gate 1502, as finally etched in step 183 (FIG. 1E), extends beyond the edge of the mesa top to contact the gate oxide on the side of the mesa and rest upon the substrate 204 (FIG. 17). The electrical contact 1609 for the gate 1502 is formed by etching a hole in the encasing oxide 1650 and filling the hole with tungsten or similar electrical conductor as known in the art.

Step 184 (FIG. 1E) uses a block mask that opens the middle portion of the mesa top device and the FinFET to ion implantation. For an N-FET, the source 1802, drain 1506, and gate 1502 are doped N+ in step 184 (FIG. 1E). At the same time, the P-FET body contacts are doped. The block mask opening does not completely open the entire gate 1502, leaving the left and right edges of the "vertical" bars of the "H"-shaped gate partially covered. Angled ion implantation will still dope substantially all of the gate 1502. In step 185 (FIG. 1E) the gate, source, and drain regions of the mesa-top N-FET 1321 are closed by a block mask and the body contact 1800 regions are opened for P+ doping. At the same time, the gate, source, and drain regions of mesa top P-FETs are doped P+. Other thick body FETS, as disclosed elsewhere herein, and FinFETs are concurrently doped during steps 184 and 185 (FIG. 1E), as appropriate for their FET types.

Step 187 (FIG. 1E) includes forming a silicide layer over the exposed doped silicon 1800, 1506, and 1802 on the top and sides of the mesa (not shown in FIGS. 18A–D). This silicide layer provides ohmic connection for the electrical contacts 1602, 1604, 1609 and 1800 for the source 1802, drain 1506, gate 1502, and body contacts 1800, respectively. FIG. 18B is a plan view of a body-contacted mesa FET 1321 showing section lines G–G' and H–H'. FIG. 18C is the vertical section view of section G–G'. The body 1830 lies beneath the gate 1502 and the gate oxide 1304. The body 1830 is the portion of the mesa not doped by the ion implantations which create the body contacts 1800 and then create the gate 1502, source 1802, and drain 1506. The electrical contacts 1810 are formed by etching holes in the encasing oxide 1650 and filling the hole with tungsten or similar electrical conductor as known in the art. Electrical contacts 1810 make ohmic connection through the silicide layer (not shown) covering the body contacts. FIG. 18D shows vertical section H–H' through the drain 1506. The electrical contacts 1604 and 1602 (FIG. 18B) are formed by etching holes in the encasing oxide 1650 and filling the hole with tungsten or similar electrical conductor as known in the art. The body 1830 also underlies the side-bars of the gate 1502 as well as the crossbar (FIG. 18C). In some embodiments, the electrical contacts 1810 connect in a connection plane above the device shown in FIG. 18D).

Figure 19:
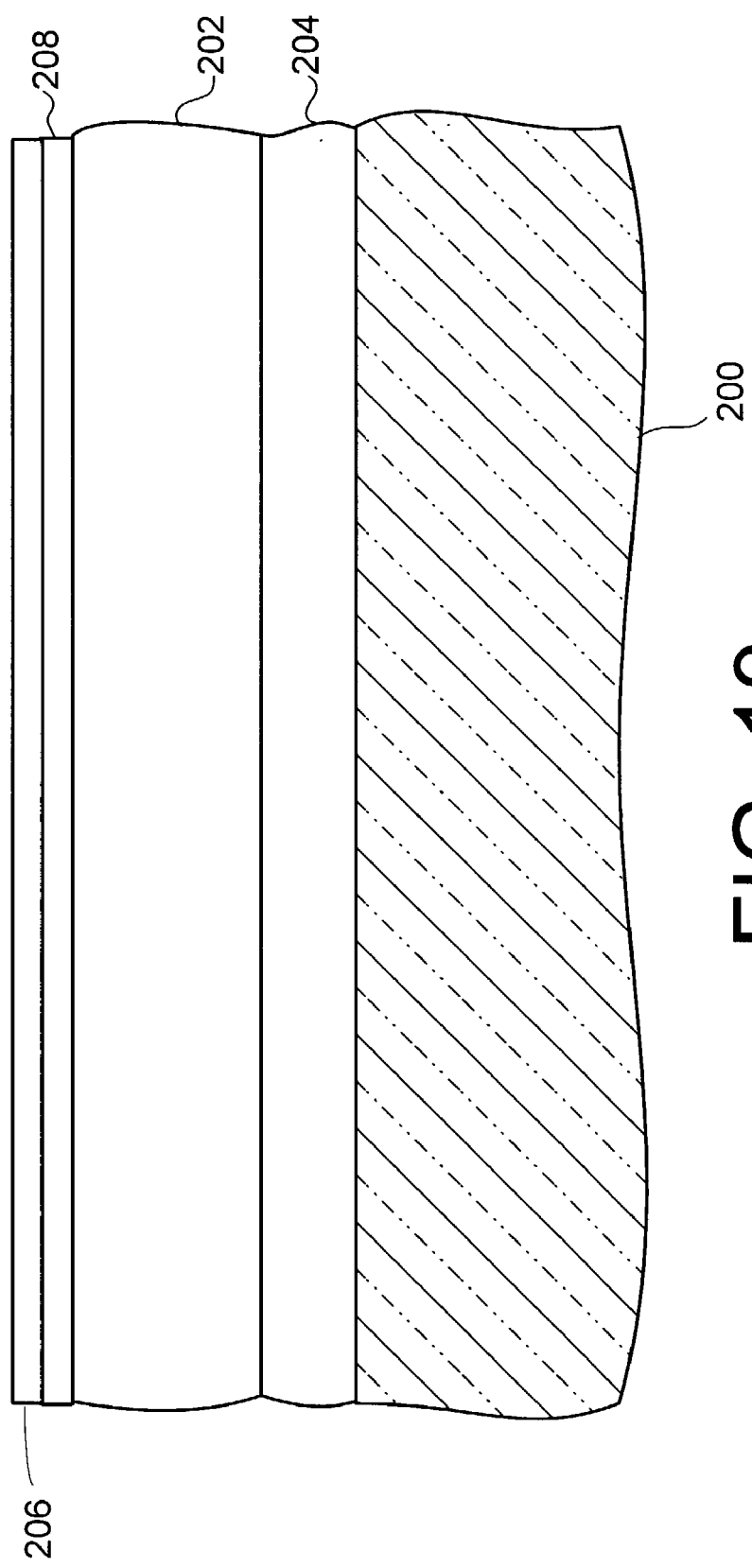

A fourth exemplary embodiment of a process 150 (FIG. 1C) concurrently produces a FinFET and a double-sided mesa FET. The embodiment 150 (FIG. 1C) begins with a substrate 200, 204, 202, 208, and 206, as shown in FIG. 19, having a hardmask consisting of an oxide layer 208 on the single crystal silicon 202 and a nitride layer 206 on the oxide layer 208. The oxide layer 208 may be a tetraehtyl oxisilate (TEOS) oxide. The buried oxide layer 204 beneath the single-crystal silicon 202 is grown on the silicon wafer 200. Other similar substrates may be used in additional embodiments.

Figure 20:
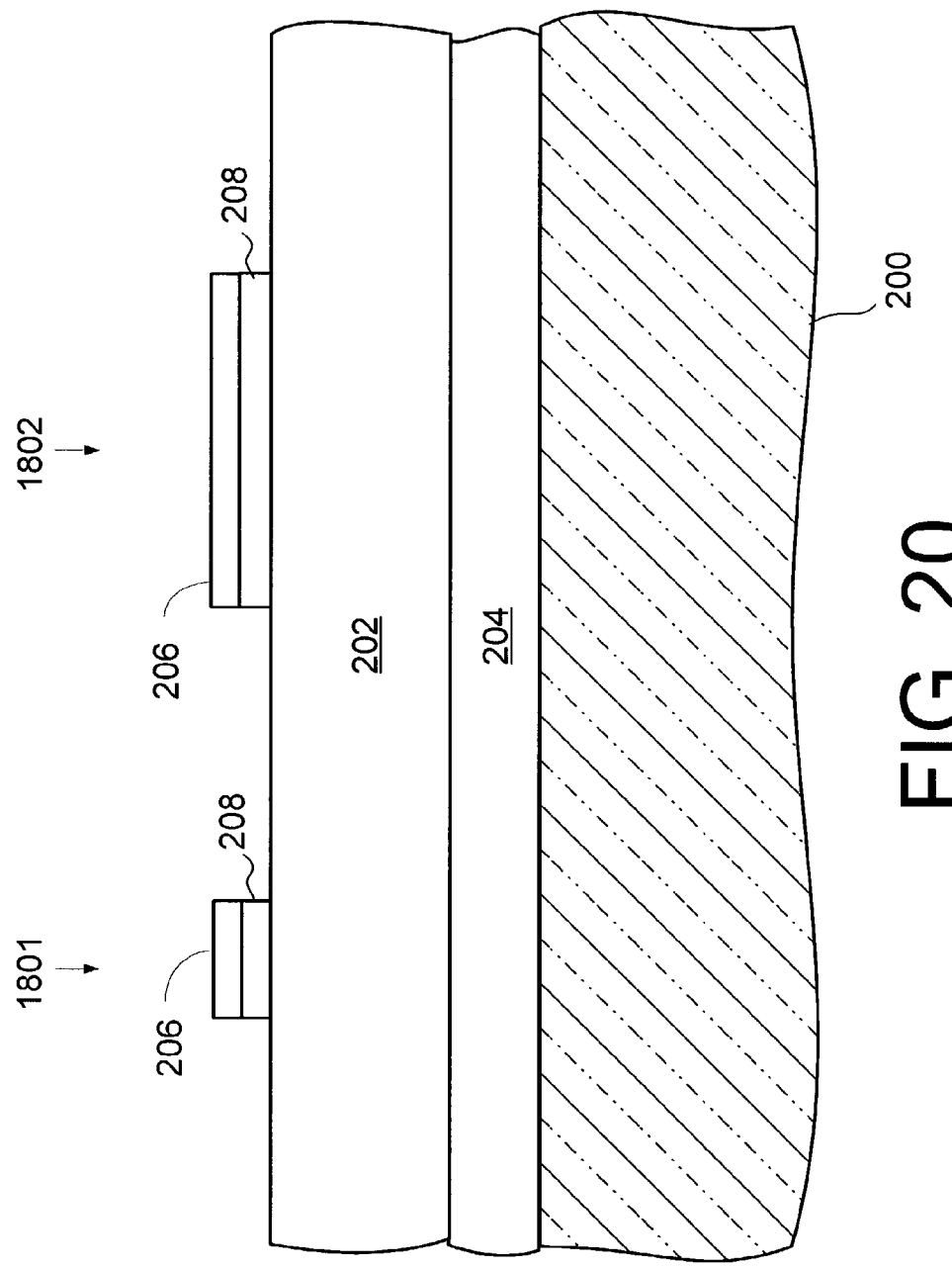

FIG. 20 shows the result of additional steps in an embodiment 150 (FIG. 1C) of the process wherein the nitride layer 206 has been patterned per step 152 (FIG. 1C) and the nitride layer 206 and the oxide layer 208 have been selectively etched (still step 152, FIG. 1C) to the single crystal silicon layer 202 to form a thin structure 1801 and a thick structure 1802. In an embodiment 150 (FIG. 1C), the width of the thin structure 1801 is the minimum lithographic dimension.

Figure 21:
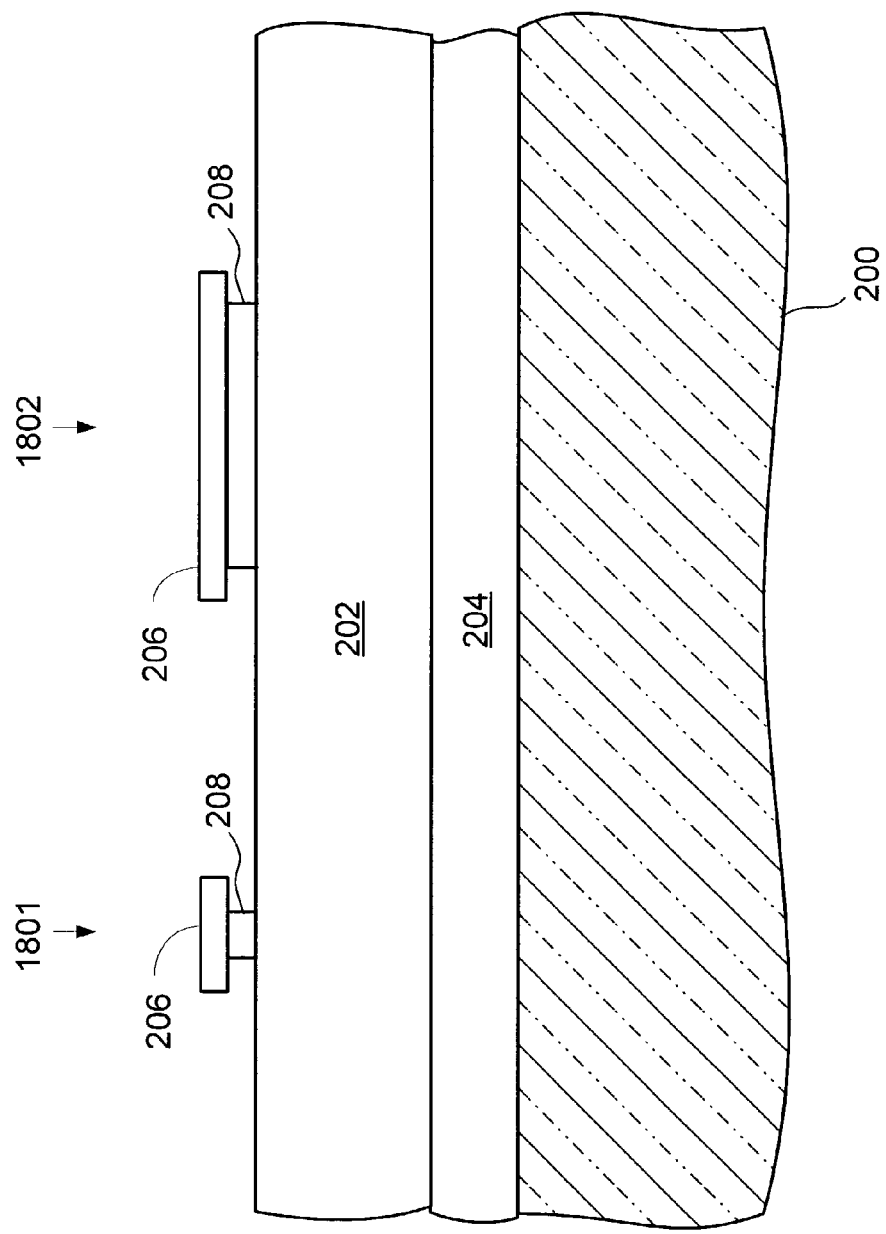

FIG. 21 shows some results of chemically undercutting the oxide layer 208 without reacting the nitride layer 206 or the single-crystal silicon layer 202. The purpose of the chemical undercutting is to achieve a fin 1801 thickness of less than the minimum lithographic dimension. The method leaves an oxide 208 strip on the single crystal silicon 202, the oxide 208 strip having a nitride 206 cap. The reduction in the size of the mesa 1802 oxide 208 strip is unavoidable and can be compensated for by patterning the mesa 1802 hardmask 206, 208 larger than the final desired size. Because chemical undercutting is performed to create a pattern for the width of the fin 1801, these actions are included in the patterning step 152.

Figure 22:
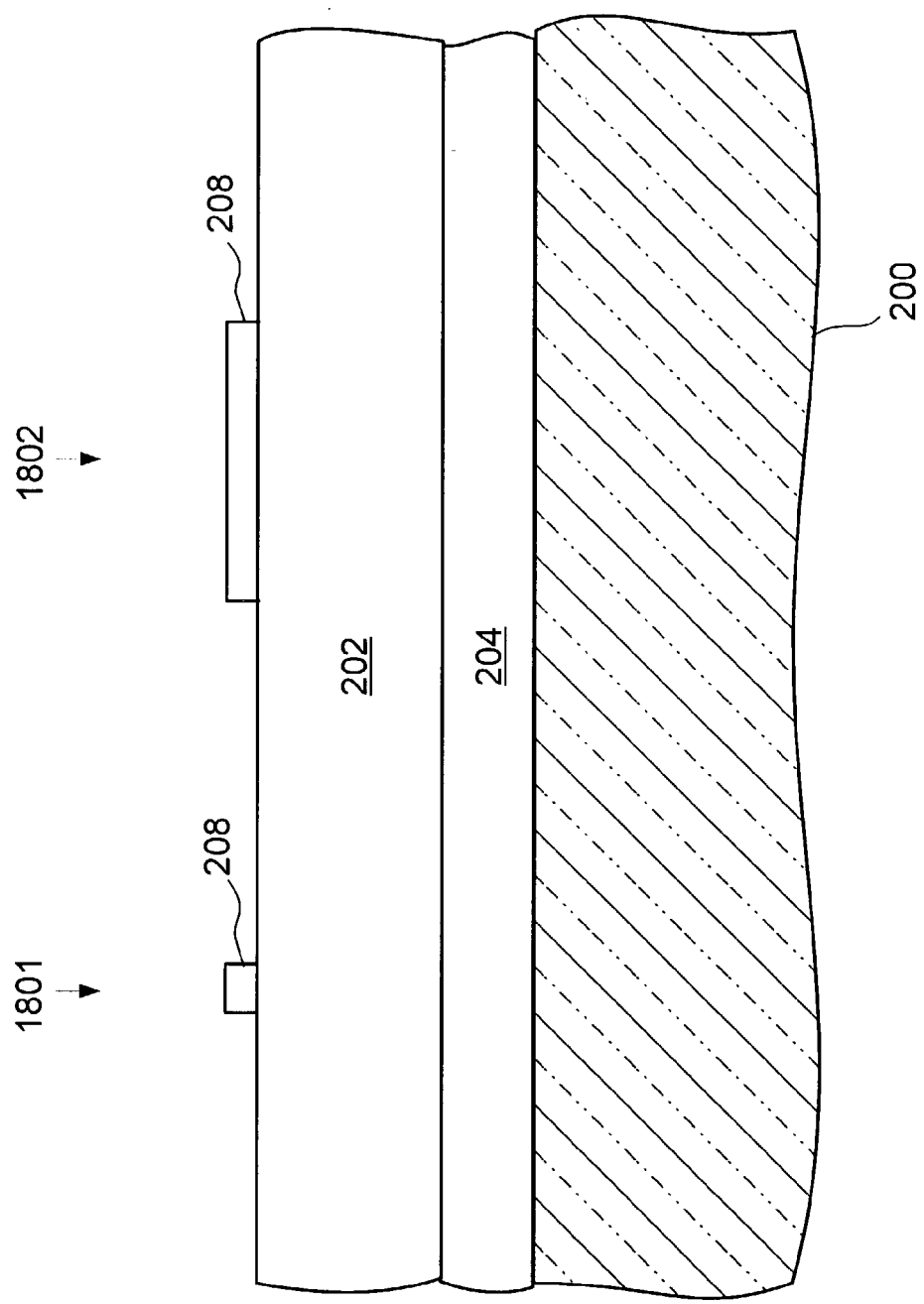

FIG. 22 shows some results of selectively etching away the nitride 206 (FIG. 20) caps and leaving the oxide 208 strips on the single-crystal silicon 202. These strips define the dimensions of the fin 1801 and mesa 1802 in subsequent steps. As such, etching away the nitride cap is the final sub-step of step 152 (FIG. 1C).

Figure 23:
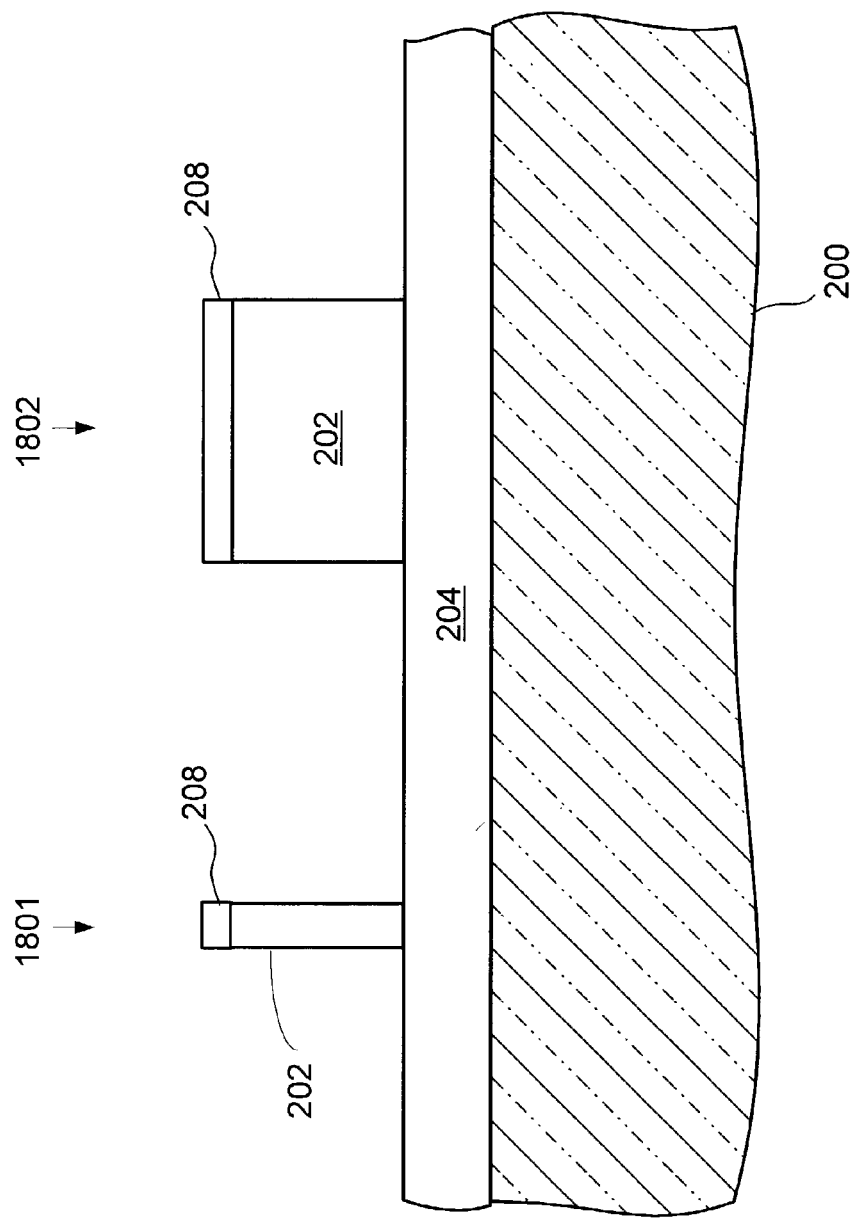

FIG. 23 shows some results of etching 154 (FIG. 1C) the single-crystal silicon 202 selective to the top oxide layer 208 down to the buried oxide 204. The etching step 154 (FIG. 1C) forms a fin 1801 with a thickness less than minimal lithographic dimension and a mesa 1802. Transistors will next be formed on three surfaces: one sidewall of the fin 1801 and two sidewalls of the mesa 1802.

Figure 24:
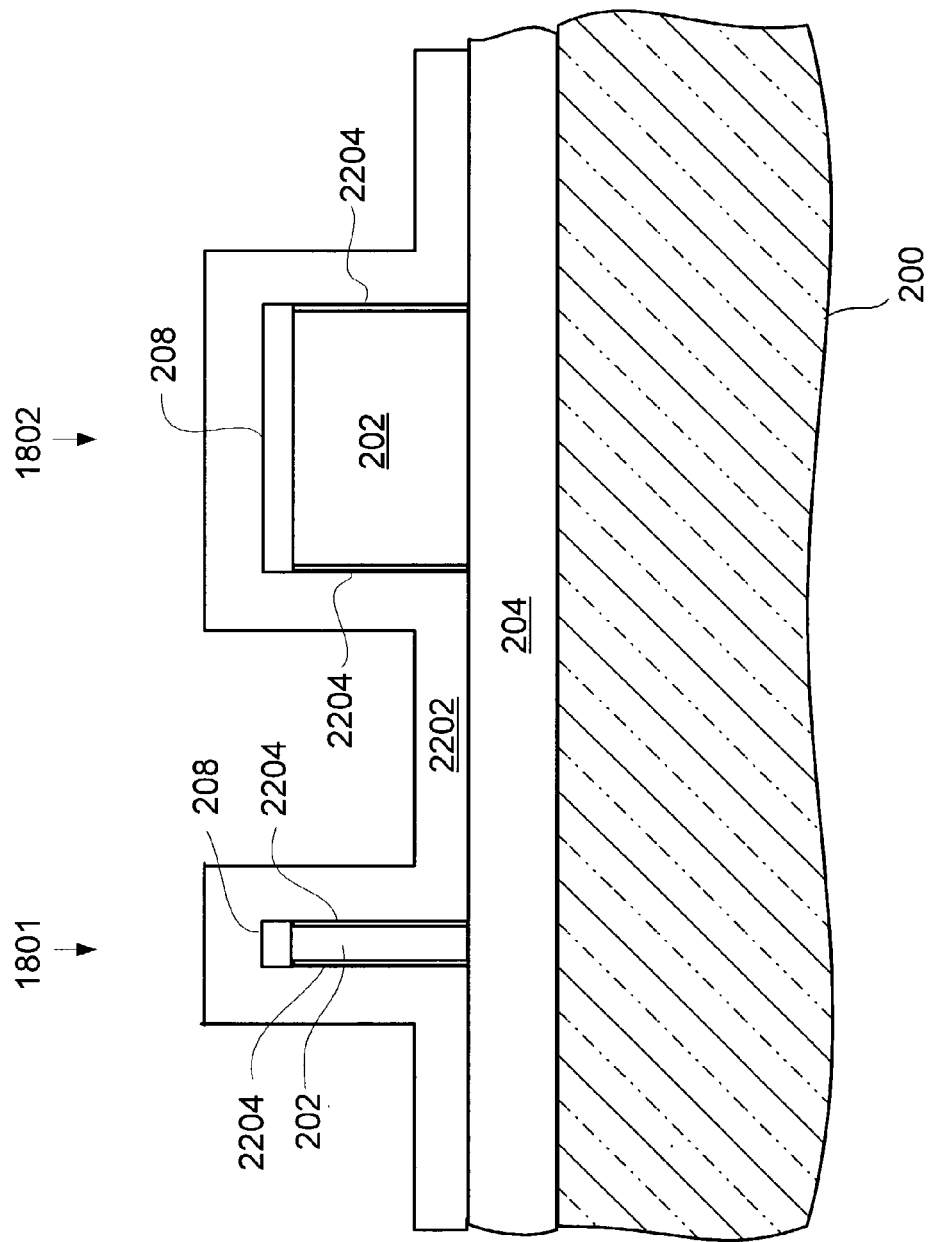

FIG. 24 shows some results of growing a gate oxide 2204 and depositing gate material 2202 over the fin 1801 and mesa 1802. Thus begins step 156 (FIG. 1C): forming the gate structures. Gate oxide 2204 will provide ohmic contact between the gate material 2202 and the body 202.

The gate material 2202 is concurrently patterned and concurrently etched to achieve the correct size and shape, completing step 156 (FIG. 1C). The sources and drains are formed concurrently by ion implantation, completing step 158 (FIG. 1C). In an embodiment, step 158 concurrently dopes the sources and drains of other N-FETs on the same chip as well as body contacts of other P-FET devices on the same chip.

Figure 25A:
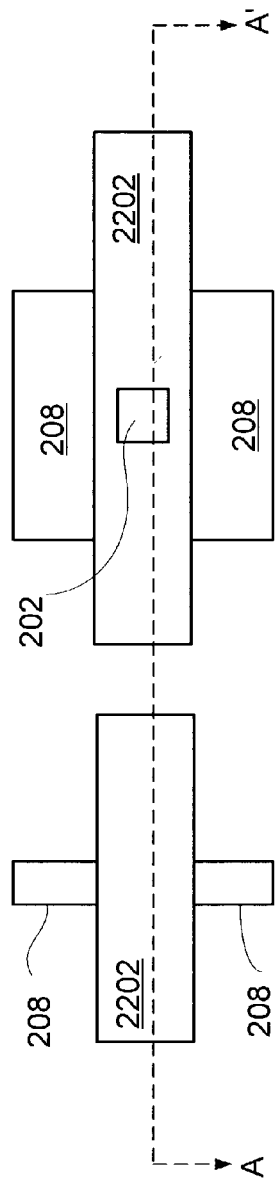
FIG. 25A shows a plain view of some results of the steps of patterning and etching the gate material on the mesa and the fin.

FIG. 25A shows a plan view of the fin 1801 and the mesa 1802. From the plan view of the fin 1801, the gate material 2202 and the top oxide 208 are visible. The result of patterning and etching the gates 2202 (part of step 156, FIG. 1C) can be seen in FIG. 25A. From the plan view of the mesa 1802, the gate material 2202 and the top oxide 208 are also visible, along with a view of the mesa body 202 as seen through a hole etched through the gate material 2202 and through the top oxide 208 to the mesa body. The hole provides a means for making an electrical connection with the body 202. At the point of contact on body 202, the single-crystal silicon body 202 is doped in step 160 (FIG. 1C) to create a body contact. FIG. 25A defines a vertical section A–A' which is illustrated in FIG. 25B.

Figure 25B:
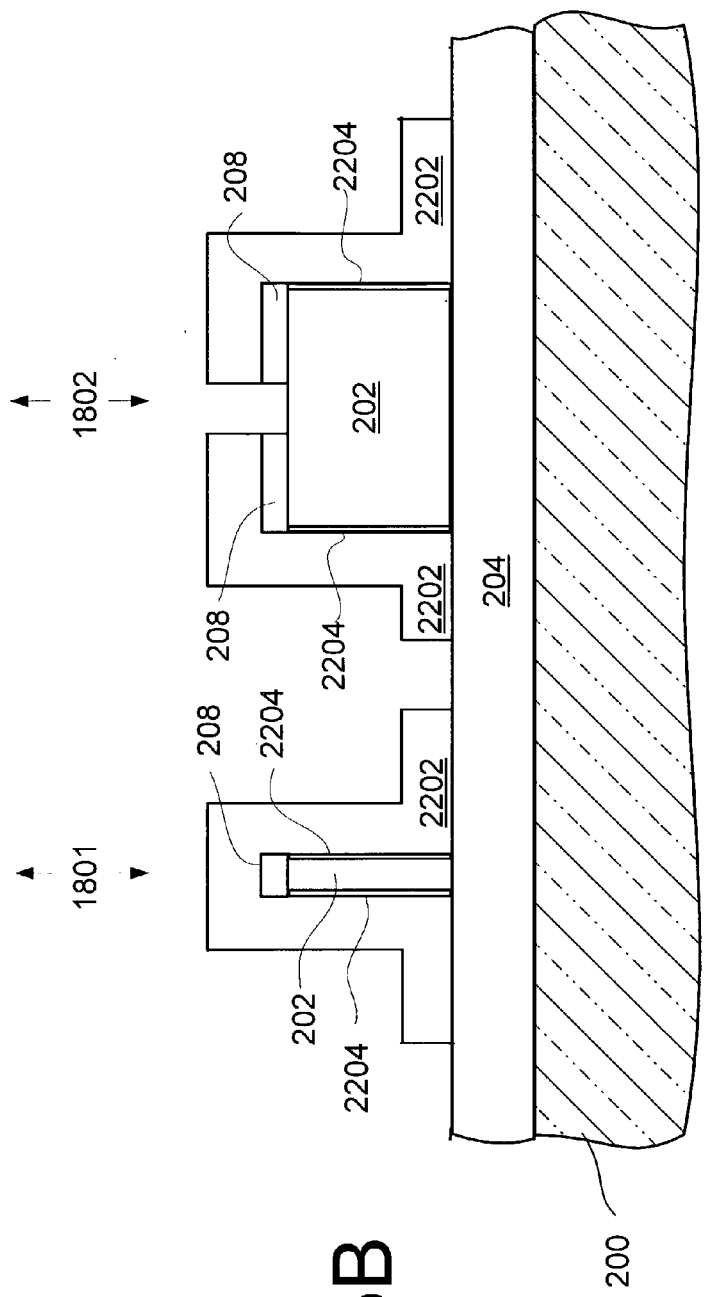
FIG. 25B shows a vertical section view of plane A–A' illustrating some results of the steps of patterning and etching the gate material on the mesa and the fin.

Referring to FIG. 25B, the fin 1801 is double-gated by the gate material 2202 adjacent to both sides of the fin making electrical contact through the gate oxide 2204 on both sides of the fin 1801, and so requires no body contact. The gate 2202 contacting the mesa 1802 provides a common gate for the FETs on the two sidewalls. The FETs on opposite mesa 1802 sides are electrically in parallel, forming a higher powered FET than either a single-sidewall FET or a FinFET.

FIG. 26A shows, in embodiment of the process 150 (FIG. 1C), a plan view of some results of encasing the devices 1801 and 1802 in oxide 2302, planarizing the oxide 2302, patterning the oxide 2302 for holes for electrical contacts, etching the holes, and filling the holes with metal or other suitable conductors to form electrical contacts 2304, 2306, 2308, 2310, and 2312 to the gates, sources, drains and the body contact on the thick-body device 1802 (Step 164, FIG. 1C). FIG. 26A defines a vertical section A–A' which is shown in FIG. 26B.

Referring to FIG. 26B the FinFET gate electrical contact 2304, the body contact electrical contact 2310, and the double-sidewall mesa FET gate electrical contact 2308 are shown in cross section. The fin 1801 gate electrical contact 2304 contacts a portion of the gate 2202 that is deposited on the buried oxide 204. The body electrical contact 2310 penetrates the gate 2202 and the hardmask remnant 208 to reach the portion of the body 202 which has not been doped as a source or a drain. In the vertical A–A' plane, mesa body 202 and fin body 202 are unaffected by source and drain ion implantation.

FIG. 26A also defines a vertical section B–B' through the drain 2210 regions of the fin 1801 and the double-sidewall mesa FET 1802. FIG. 26C shows the vertical section through the drains 2210. Referring to FIG. 26C, the fin 1801 source contact 2306 (hidden behind 2312 in this view, see FIG. 26A) and drain contact 2312 are based partially on the buried oxide 204 and partially on the hardmask remnant cap 208 on top of the fin 1801. The fin 1801 source contact 2306 and drain contact 2312 make contact with the vertical face of the fin over the source and drain regions, respectively. A silicide layer may be grown on exposed silicon surfaces of the fin 1801 and mesa 1802 as a first sub-step in step 164 (FIG. 1C) to ensure ohmic contacts for the electrical contacts 2304, 2306, 2307, 2308, 2310, 2312, and 2313. The thick-body device 1802 has a drain contact 2313 which penetrates the hardmask remnant 208 to contact both drain regions 2210 (left and right, as viewed) in the single-crystal silicon substrate 202. The thick-body device 1802 also has a source electrical contact 2307 that penetrates the hardmask remnant 208 to contact both source regions (left and right, out of view) in the single-crystal silicon substrate 202. The FET on the right sidewall of mesa 1801 and the FET on the left sidewall of mesa 1801, are electrically connected at the sources, drains, gates, and body. Consequently, the FETs operate in parallel as a higher-powered FET. In an embodiment, the source and drain regions of the opposite sidewall FETs meet. In such an embodiment, the view of FIG. 26C would show no silicon 202 between drain regions 2210, which would appear as a single region completely across the widht of the mesa.

FIG. 26D shows an alternate embodiment a fin source or drain electrical contact 2314 which contacts both sides of the source or drain region of the fin.

Those skilled in the art will appreciate that combinations and variations of the four illustrated embodiments can be made to allow creation of FinFETs, single-sidewall body-contacted mesa FETs, double-sided body-contacted mesa FETs, and planar mesa-top FETs on the same chip. For example, embodiments of the processes 130 (FIG. 1B, single-sidewall body-contacted mesa FET) and 170 (FIG. 1D, mesa-top planar FETs) can be altered to form the gate before the sources and drains are ion-implanted, thereby allowing a common gate-formation step for all four of the exemplary embodiments on one chip. Likewise, a sub-step required for only one embodiment can be achieved at some cost to efficiency by masking all other embodiments while the unique sub-step is executed. Those skilled in the art can vary and combine embodiments of the devices on a single chip within the bounds of the present invention.

We claim:

1. A method of fabricating an integrated circuit chip having at least one fin-type field effect transistor and at least one thick-body device, the method comprising at least one stop using a mask and a process associated with the mask to concurrently fabricate the at least one fin-type field effect transistor and the at least one thick-body device.

2. The method of claim 1, further comprising:
providing a hard-masked semiconductor substrate wafer; and
patterning the semiconductor substrate wafer; and
patterning the semiconductor substrate to concurrently form at least one narrow fin structure and at least one thick mesa structure on the wafer, the fin structure having first and second parallel sidewalls, the mesa having a top surface and third and fourth parallel sidewalls.

3. The method of claim 1, comprising the steps of:
a) etching a semiconductor substrate to concurrently create at least one fin having a top and sidewalls and at least one mesa structure having a top and sidewalls;
b) forming gate structures concurrently on the at least one fin and on at least one mesa, the gate structures defining areas for forming at least one source and at least one drain on the at least one fin and on the at least one mesa;
c) forming source and drain regions concurrently on the at least one fin and on the at least one mesa in said areas defined by the respective gate structures;
d) forming electrical contacts concurrently to the gate, source, and drain of the at least one fin and to the gate, source, and drain of the at least one mesa.

4. The method of claim 1, further comprising the steps of:
a) doping a source, a drain, and a gate of the at least one fin-type field effect transistor concurrently with doping a source, a drain, and a gate of the at least one thick-body device and further concurrently doping a body contact of at least one complimentary device; and
b) doping a body contact of the at least one thick-body device concurrently with doping a source, a drain, and a gate of the at least one complimentary device.

5. The method of claim 4, adapted to creating a single sidewall thick-body device, the method comprising the steps of:
a) providing a hard-masked semiconductor substrate wafer;
b) patterning the semiconductor substrate to form at least one narrow fin structure and at least one thick mesa structure on the wafer, the fin structure having first and second parallel long sidewalls, the mesa having a top surface and first and second parallel long side walls;
c) conformally depositing a gate material on the at least one fin and the at least one mesa;
d) concurrently patterning a gate on the first and second long sidewalls of the at least one fin structure and a gate on the first long sidewall of the at least one mesa structure;
e) concurrently etching a gate on the at least one fin structure and a gate on the at least one mesa structure;
f) concurrently doping:
a source region and a drain region on at least one long sidewall of the at least one fin;
a gate on the at least one fin;
a source region and a drain region on at least one long sidewall of the at least one mesa; and
a gate on the at least one mesa, g) doping a body contact region in the at least one mesa by ion-implantation through the second long sidewall;
h) simultaneously forming a silicide on the at least one fin-type device and the at least one mesa-type device semiconductor surfaces;
i) encasing the wafer in oxide and planarizing the oxide; and
j) concurrently forming electrical contacts to the gates, sources, drains, and body contact regions of each fin-type device and each mesa-type device.

6. The method of claim 4, adapted to creating a double-sided field effect transistor, the method comprising the steps of:
a) providing a hard-masked semiconductor substrate comprising a nitride cap layer on a TEOS layer on a single crystal silicon layer on a buried oxide layer on a silicon wafer;
b) concurrently patterning the nitride and TEOS layers to form images of the at least one fin structure having a minimum lithographic thickness and the at least one mesa;
c) concurrently narrowing the thickness of the at least one fin and the at least one mesa by chemically undercutting the nitride cap;
d) concurrently stripping the nitride caps;
e) transferring the image of the TEOS layer into the silicon layer using reactive ion etching to concurrently form the at least one fin structure and the at least one mesa structure on the substrate, the at least one fin structure having first and second parallel long sidewalls, the at least one mesa having a top surface and first and second parallel long side walls;
f) forming a gate on a gate dielectric on a middle portion of the long sidewalls and top of the at least one fin structure and concurrently forming a gate on a gate dielectric on a middle portion of the long sidewalls and top of the at least one mesa structure, the gate structures extending outward from the at least one fin structure and the at least one mesa structure onto the buried oxide of the substrate;
g) doping a source and a drain into the at least one fin structure concurrently with doping a source and a drain into the first and second long sidewalls of the at least one mesa structure, the source and the drain being separated on the first long sidewall of the at least one fin structure by the fin gate structure and the source and the drain being separated on each long sidewall of the at least one mesa structure by the mesa gate structure, wherein the gates are concurrently doped with the sources and drains, thereby forming at least one fin-type field effect transistor and at least one thick-body device;
h) forming a body contact through the top of the at least one thick-body device;
i) encasing the wafer in oxide and planarizing the oxide; and
j) concurrently forming electrical contacts to the gates, sources, drains, and the at least one body contact.

7. The method of claim 4, adapted to creating a planar field effect transistor on a mesa top, the method comprising the steps of:
a) providing a hard-masked semiconductor substrate wafer;
b) patterning the semiconductor substrate to concurrently form at least one narrow fin structure and at least one thick mesa structure on the wafer, the fin structure having first and second parallel long sidewalls, the mesa having a top surface and first and second parallel long side walls;
c) preparing the top of the at least one mesa by:
   (1) block masking the at least one fin;
   (2) etching, selective to the block mask, the hardmask off of the top of the at least one mesa; and
   (3) stripping the block mask;
d) growing a gate oxide concurrently on the top of the at least one mesa and on the long sidewalls of the fin;
e) depositing gate material concurrently on at least one fin and on the at least one mesa;
f) planarizing the gate material concurrently on the at least one fin and on the at least one mesa;
g) patterning the gate structure concurrently on the at least one fin and on the at least one mesa;
h) etching the gate structure concurrently on the at least one fin and on the at least one mesa;
i) concurrently ion implanting:
   1) source and drain walls on the top of the at least one mesa;
   2) the gate of the at least one mesa;
   3) the source and drain regions of the at least one Fin;
   4) the gate of the at least one fin; and
   5) the body contacts of complimentary devices;
j) concurrently ion implanting:
   1) body contacts on the top of the at least one mesa;
   2) at least one source, at least one drain, or at least one gate on the at least one complimentary device;
k) forming a silicide concurrently on the exposed semiconductor surfaces of the at least one fin and at least one mesa;
l) encasing the wafer in oxide and planarizing the oxide; and
m) concurrently forming electrical contacts to the:
   1) gate, source, drain, and body contact on the top of the at least one mesa; and
   2) gate, source, and drain of the at least one fin; and
   3) body contact on at least one other device on the wafer.

8. The method of claim 2, further comprising:
a) block masking the at least one fin structure;
b) etching, selective to the block mask, the hardmask off of the top of the at least one mesa structure; and
c) stripping the block mask;
d) ion implanting source and drain regions concurrently on the top of the at least one mesa and on at least one of the first parallel sidewall of the fin structure and the second parallel sidewall of the fin structure;
e) growing a gate oxide concurrently on the top of the at least one mesa structure and on both of the parallel sidewalls of the fin structure; and
f) depositing gate material concurrently on the top and both parallel sidewalk of the at least one fin structure and the at least one mesa structure.

9. The method of claim 8 further comprising:
a) planarizing the gate material concurrently on the at least one fin structure and on the at least one mesa structure;
b) patterning gate structures concurrently on the at least one fin structure and on the at least one mesa structure;
c) etching the gate structures concurrently on the at least one fin structure and on the at least one mesa structure;
d) encasing the wafer in oxide and planarizing the oxide; and
e) concurrently forming electrical contacts to the gate, source, and drain on top of the at least one mesa and to the gate, source, and drain on at least one other device on the wafer.

10. The method of claim 9, wherein fabricating further comprises:
forming a gate, a source, and a drain on at least one sidewall of the at least one mesa;
forming a gate, a source, and a drain on a sidewall of the at least one fin; and
forming a body contact in the body of the thick-body device.

11. The method of claim 9, wherein the step of forming electrical contacts further comprises the step of forming at least one electrical contact to at least one body contact.

12. The method of claim 11 wherein the step of forming at least one electrical contact to at least one body contact comprises forming an electrical contact with an ohmic connection to the inactive sidewall of the body-contact-doped mesa.

13. The method of claim 11 wherein the step of forming at least one electrical contact to at least one body contact comprises forming an electrical contact with an ohmic connection to the body-contact-doped mesa through a hole in the top of the mesa.

14. The method of claim 9 wherein the steps of patterning and etching the at least one fin and the at least one mesa on the substrate comprise the steps of:
patterning the at least one fin and the at least one mesa on a dual-layer hardmask;
etching through both layers of the dual-layer hardmask selective to a semiconductor layer of the substrate;
chemically etching the lower layer of the dual-layer hardmask, selective to the semiconductor layer and the upper hardmask layer, to achieve a lower-level hardmask fin thickness of less than minimal lithographic dimension;
etching away the upper layer of the hardmask selective to the lower layer and the semiconductor; and
vertically etching the semiconductor layer selective to the lower layer of the hardmask to form at least one fin and at least one mesa.

15. The method of claim 10 wherein the step of forming a gate, a source, and a drain on at least one sidewall of the at least one mesa comprises forming a gate, a source, and a drain on each of two opposite sidewalls of the mesa, the gate further being sized and shaped conformally over the top of a mesa hardmask to bridge the two sidewall gates together physically and electronically.

16. The method of claim 10, wherein the step of forming the body contact in the mesa further comprises the steps of:
a) doping the mesa through the mesa sidewall opposite an active mesa sidewall;
b) forming silicide on the doped mesa sidewall and top of the body contact to enable an ohmic connection with an electrical contact; and
c) forming an electrical contact to the silicide on the body contact concurrently with the formation of the electrical contacts to the gate, source and drain.

17. The method of claim 10, wherein forming the gate comprises patterning and etching the gate material on the top of the mesa to divide the top of the mesa into three regions: source, drain, and body contact.

18. The method of claim 17, wherein the step of forming the body contact comprises:

patterning and etching a hole through the mesa hardmask to the body of the mesa; and doping the body through the hole in the mesa hardmask to form a body contact.

19. The method of claim 15, wherein the step of forming a gate over the top of the mesa hard mask further comprises the steps of patterning and etching a hole through the gate material and through the mesa hardmask to expose a body of the field effect transistor.

20. The method of claim 15, wherein the steps of forming the source and drain regions comprises doping the source regions and drain regions sufficiently deep into the at least one mesa that a first electrical contact through a first hole in the mesa hardmask makes a connection with both sources and a second electrical contact through a second hole in the top of the mesa hardmask makes a connection with both drains.

21. The method of claim 15 further comprising: forming a gate having a portion extending outward from the mesa active sidewall, the extended gate sized and shaped to have a widened end to receive an electrical contact, the widened end resting on buried oxide.

22. The method of claim 19, wherein the step of forming a body contact comprises the step of doping the exposed body of the field effect transistor through the hole in the gate and the mesa hardmask.

* * * * *